United States Patent
Wang

(10) Patent No.: US 12,016,207 B2
(45) Date of Patent: Jun. 18, 2024

(54) ARRAY SUBSTRATE, DISPLAY PANEL AND DISPLAY DEVICE

(71) Applicant: BOE Technology Group Co., Ltd., Beijing (CN)

(72) Inventor: Zhichong Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 381 days.

(21) Appl. No.: 17/556,721

(22) Filed: Dec. 20, 2021

(65) Prior Publication Data

US 2022/0278183 A1 Sep. 1, 2022

(30) Foreign Application Priority Data

Feb. 26, 2021 (CN) .......................... 202110220205.0

(51) Int. Cl.
*H10K 59/12* (2023.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/1315* (2023.02)

(58) Field of Classification Search
CPC ........... H10K 59/1213; H10K 59/1216; H10K 59/1315

USPC .......................................................... 257/40
See application file for complete search history.

(56) References Cited

U.S. PATENT DOCUMENTS

2021/0074213 A1* 3/2021 Huang ................. G09G 3/3258
2021/0193766 A1* 6/2021 Liu ....................... H10K 59/353

FOREIGN PATENT DOCUMENTS

CN 111628005 A * 9/2020 ......... H01L 29/0653
WO WO-2021018304 A1 * 2/2021 ....... G02F 1/134309

* cited by examiner

*Primary Examiner* — Phuc T Dang
(74) *Attorney, Agent, or Firm* — IPro, PLLC

(57) ABSTRACT

Provided are an array substrate, a display panel and a display device. The array substrate includes multiple sub-pixel units arranged in an array. Each sub-pixel unit includes a pixel circuit structure and a light-emitting element; the pixel circuit structure includes a driving transistor, a first reset transistor and a second reset transistor; each of the driving transistor, the first reset transistor and the second reset transistor includes an active structure, a first insulating structure on the active structure, and a first metal layer structure on the first insulating structure; the active structure of the first reset transistor of an i-th row of sub-pixel unit is electrically coupled to an anode of the light-emitting element of the i-th row of sub-pixel unit, and is electrically coupled to the active structure of the second reset transistor of an (i+1)-th row of sub-pixel unit, i being an integer greater than 0.

17 Claims, 27 Drawing Sheets

ARRAY SUBSTRATE, DISPLAY PANEL AND DISPLAY DEVICE

CROSS-REFERENCE TO RELATED APPLICATION

This application claims a priority to Chinese Patent Application No. 202110220205.0 filed on Feb. 26, 2021, the disclosure of which is incorporated in its entirety by reference herein.

TECHNICAL FIELD

The present disclosure relates to the technical field of display panels, in particular to an array substrate, a display panel and a display device.

BACKGROUND

In a pixel circuit structure of display technologies such as OLED (Organic Light-Emitting Diode) and quantum dots, the arrangement of many TFTs (Thin Film Transistors) and the exposure accuracy of existing exposure machines limit the improvement of a pixel density such as PPI (Pixels Per Inch).

SUMMARY

In a first aspect, embodiments of the present disclosure provide an array substrate, including: a plurality of sub-pixel units arranged in an array on a base substrate. Each of the sub-pixel units includes a pixel circuit structure and a light-emitting element; the pixel circuit structure includes a driving transistor, a first reset transistor and a second reset transistor; each of the driving transistor, the first reset transistor and the second reset transistor includes an active structure, a first insulating structure on the active structure, and a first metal layer structure on the first insulating structure; the active structure of the first reset transistor of an i-th row of sub-pixel unit is electrically coupled to an anode of the light-emitting element of the i-th row of sub-pixel unit, and is electrically coupled to the active structure of the second reset transistor of an (i+1)-th row of sub-pixel unit, i being an integer greater than 0; and in each of the sub-pixel units, the first metal layer structure of the driving transistor is electrically coupled to the active structure of the second reset transistor.

In a possible implementation, each of the sub-pixel units further includes a second insulating structure, a second metal layer structure, a first interlayer dielectric layer, and a third metal layer structure that are stacked on the first metal layer structure, and in the sub-pixel unit, the first metal layer structure of the driving transistor is electrically coupled to a first end of the third metal layer structure of the sub-pixel unit, and a second end of the third metal layer structure is electrically coupled to the active structure of the second reset transistor.

In a possible implementation, an orthographic projection of the first end of the third metal layer structure onto the base substrate of the sub-pixel unit is at least partially overlapped with an orthographic projection of the first metal layer structure of the driving transistor onto the base substrate, and at an area where the orthographic projections are overlapped, a first via hole is arranged in the second insulating structure and the first interlayer dielectric layer structure; and the first end of the third metal layer structure is electrically coupled to the first metal layer structure of the driving transistor through the first via hole.

In a possible implementation, an orthographic projection of the second end of the third metal layer structure onto the base substrate is at least partially overlapped with an orthographic projection of the active structure of the second reset transistor onto the base substrate, and at an area where the orthographic projections are overlapped, a second via hole is arranged in the first insulating structure, the second insulating structure, and the first interlayer dielectric layer structure; and the second end of the third metal layer structure is electrically coupled to the active structure of the second reset transistor through the second via hole.

In a possible implementation, each of the sub-pixel units further includes a second interlayer dielectric layer structure on the third metal layer structure and a fourth metal layer structure on the second interlayer dielectric layer structure; a third via hole is arranged in the first interlayer dielectric layer structure and the second interlayer dielectric layer structure; and the fourth metal layer structure is electrically coupled to the second metal layer structure through the third via hole.

In a possible implementation, in each of the sub-pixel units, one of the first metal layer structure of the sub-pixel unit includes the first metal layer structure of the driving transistor; each of the sub-pixel units further includes a second insulating structure, a second metal layer structure, a first interlayer dielectric layer structure, a third metal layer structure, a second interlayer dielectric layer and a fourth metal layer structure that are stacked on the first metal layer structure; an orthographic projection of the second metal layer structure onto the base substrate partially overlaps with an orthographic projection of the first metal layer structure onto the base substrate, and a first capacitor is formed between the second metal layer structure and the first metal layer structure at an area where the orthographic projections are overlapped; an orthographic projection of the third metal layer structure onto the base substrate partially overlaps with the orthographic projection of the second metal layer structure onto the base substrate, and a second capacitor is formed between the third metal layer structure and the second metal layer structure at an area where the orthographic projections are overlapped; and an orthographic projection of the fourth metal layer structure onto the base substrate partially overlaps with the orthographic projection of the third metal layer structure onto the base substrate, and a third capacitor is formed the fourth metal layer structure and the third metal layer structure at an area where the orthographic projections are overlapped.

In a possible implementation, the third metal layer structure serves as a reset signal line, and is configured to receive a reset signal; and the fourth metal layer structure serves as a power supply line, and is configured to receive a power supply voltage.

In a possible implementation, each of the sub-pixel units further includes a third insulating structure, a fifth metal layer structure, a third interlayer dielectric layer structure, a sixth metal layer structure, a fourth interlayer dielectric layer structure and a seventh metal layer structure that are stacked; and in the sub-pixel unit, the first metal layer structure of the driving transistor is electrically coupled to a first end of the seventh metal layer structure of the sub-pixel unit, and a second end of the seventh metal layer structure is electrically coupled to an active structure of the reset transistor.

In a possible implementation, an orthographic projection of the first end of the seventh metal layer structure onto the base substrate of the sub-pixel unit at least partially overlaps with an orthographic projection of the first metal layer structure of the driving transistor onto the base substrate, and at an area where the orthographic projections are overlapped, a fourth via hole is arranged in the third insulating structure, the third interlayer dielectric layer structure and the fourth interlayer dielectric layer structure; and the first end of the seventh metal layer structure is electrically coupled to the first metal layer structure of the driving transistor through the fourth via hole.

In a possible implementation, an orthographic projection of the second end of the seventh metal layer structure onto the base substrate at least partially overlaps with an orthographic projection of the active structure of the second reset transistor onto the base substrate, and at an area where the orthographic projections are overlapped, a fifth via hole is arranged in the third insulating structure, the third interlayer dielectric layer structure and the fourth interlayer dielectric layer structure; and the second end of the seventh metal layer structure is electrically coupled to the active structure of the second reset transistor through the fifth via hole.

In a possible implementation, the third interlayer dielectric layer structure is provided with a sixth via hole; and the sixth metal layer structure is electrically coupled to the fifth metal layer structure through the sixth via hole.

In a possible implementation, an orthographic projection of the fifth metal layer structure onto the base substrate partially overlaps with an orthographic projection of the first metal layer structure onto the base substrate, and at an area where the orthographic projections are overlapped, a fourth capacitor is formed between the fifth metal layer structure and the first metal layer structure; and an orthographic projection of the seventh metal layer structure onto the base substrate partially overlaps with an orthographic projection of the sixth metal layer structure onto the base substrate, and at an area where the orthographic projections are overlapped, a fifth capacitor is formed between the seventh metal layer structure and the sixth metal layer structure.

In a possible implementation, the seventh metal layer structure serves as a reset signal line, and is configured to receive a reset signal; and the sixth metal layer structure serves as a power supply line, and is configured to receive a power supply voltage.

In a possible implementation, both the first metal layer structure of the first reset transistor of the i-th row of sub-pixel unit, and the first metal layer structure of the second reset transistor of the (i+1)-th row of sub-pixel unit belong to the same first metal layer structure of the (i+1)-th row of sub-pixel unit.

In a second aspect, embodiments of the present disclosure provide a display panel, which includes the array substrate according to any embodiment in the first aspect.

In a third aspect, embodiments of the present disclosure provide a display device, which includes the array substrate according to any embodiment in the first aspect or the display panel according to any embodiment in the second aspect.

BRIEF DESCRIPTION OF THE DRAWINGS

In order to clearly illustrate the technical solutions of the embodiments of the present disclosure, the drawings to be used in the description of the embodiments of the present disclosure will be described briefly below. Obviously, the drawings in the following description are merely some embodiments of the present disclosure. According to these drawings, a person of ordinary skill in the art can obtain other drawings without creative effort.

FIG. 13b is a schematic diagram of a film structure of the second metal layer of FIG. 12c after it is manufactured on the basis of the film structure of FIG. 13a;

FIG. 16b is a schematic diagram of a film structure after the fifth metal layer of FIG. 15c is manufactured on the basis of the film structure of FIG. 16a;

REFERENCE SIGNS

Figure 1:
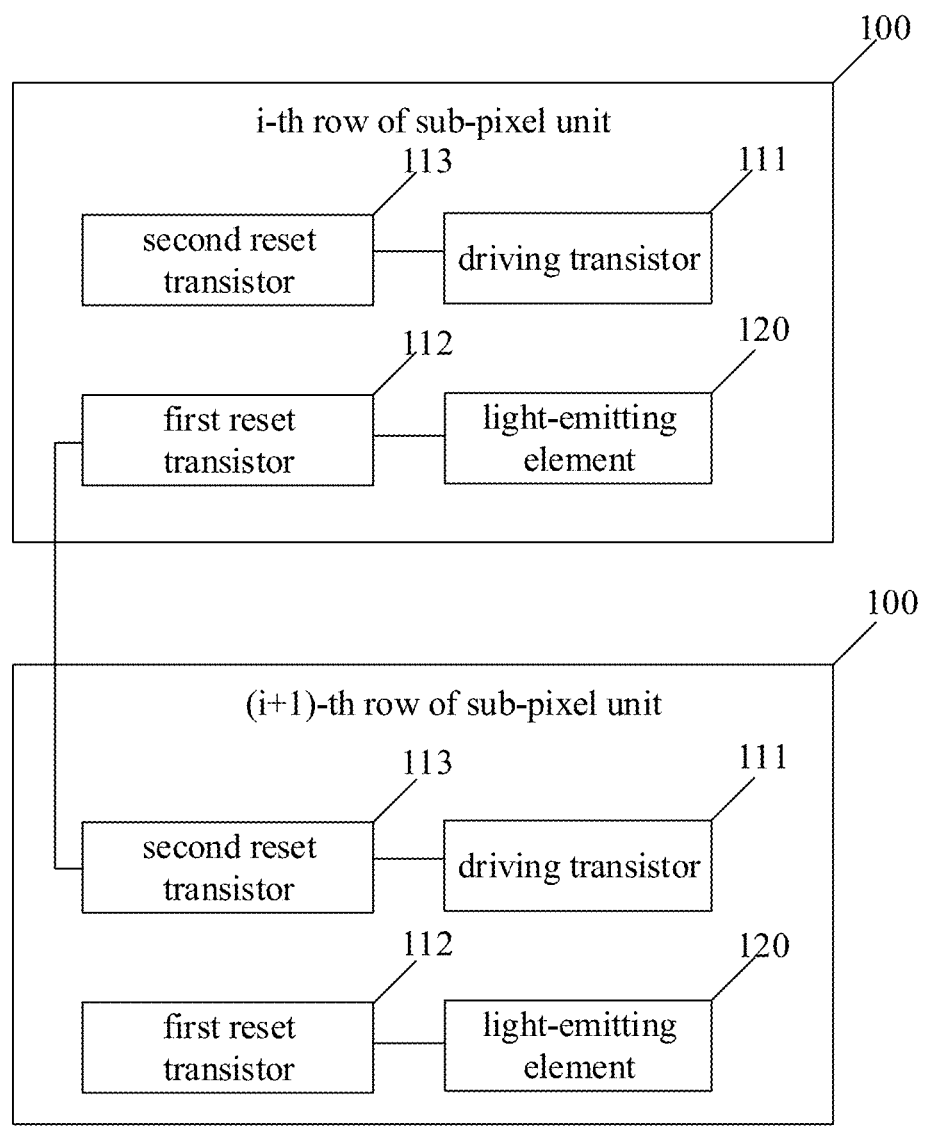
FIG. 1 is a schematic block diagram of an array substrate provided by an embodiment of the present disclosure.

100: sub pixel unit;
111: driving transistor, 112: first reset transistor, 113: second reset transistor;
1101: active structure;
1102: first insulating structure, 1103: first metal layer structure, 1104: second insulating structure, 1105: second metal layer structure, 11051: first opening, 1106: first interlayer dielectric layer structure, 1107: third metal layer structure, 1108: the second interlayer dielectric layer structure, 1109: fourth metal layer structure;
1110: third insulating structure, 1111: fifth metal layer structure, 11111: second opening, 1112: third interlayer dielectric layer structure, 1113: sixth metal layer structure, 1114: fourth interlayer dielectric layer structure, 1115: seventh metal layer structure;
1120: base substrate;
120: light-emitting element;
C1: first capacitor, C2: second capacitor, C3: third capacitor, C4: fourth capacitor, C5: fifth capacitor;
101: first via hole, 102: second via hole, 103: third via hole, 104: fourth via hole, 105: fifth via hole, 106: sixth via hole;
107: first connection portion, 108: second connection portion, 109: third connection portion, 110: fourth connection portion, 10a: fifth connection portion, 10b: sixth connection portion;
1001a: first active layer, 1001b: second active layer, 1002: first insulating layer, 1003: first metal layer, 1004: second insulating layer, 1005: second metal layer, 1006: first interlayer dielectric layer, 1007: third metal layer, 1008: second interlayer dielectric layer, 1009: fourth metal layer, 1010: third insulating layer, 1011: fifth metal layer, 1012: third interlayer dielectric layer, 1013: sixth metal layer, 1014: fourth interlayer dielectric layer, 1015: seventh metal layer;
1103a: first metal structure of first metal layer 1003, 1103b: second metal structure of first metal layer 1003, 1103c: third metal structure of first metal layer 1003, 1103d: fourth metal structure of first metal layer 1003;
1107a: first metal structure of third metal layer 1007, 1107b: second metal structure of third metal layer 1007, 1107c: third metal structure of third metal layer 1007;
1109a: first metal structure of fourth metal layer 1009, 1109b: second metal structure of fourth metal layer 1009;
1113a: first metal structure of sixth metal layer 1013, 1113b: second metal structure of sixth metal layer 1013;
1115a: first metal structure of seventh metal layer 1015, 1115b: second metal structure of seventh metal layer 1015, 1115c: third metal structure of seventh metal layer 1015, 1115d: fourth metal structure of seventh metal layer 1015, 1115e: fifth metal structure of seventh metal layer 1015.

DETAILED DESCRIPTION

To illustrate a technical problem to be solved, technical solutions and advantages in embodiments of the present disclosure more clearly, embodiments of the present disclosure will be clearly described below in conjunction with drawings in the embodiments of the present disclosure. It is apparent that the described embodiments are part of not all of the embodiments of the present disclosure. All other embodiments obtained by a person of ordinary skill in the art based on the described embodiments of the present disclosure without departing from the scope of the present disclosure shall fall within the scope of the present disclosure.

It should be noted that the same elements are denoted by the same or similar reference signs throughout the drawings. In the following descriptions, some specific embodiments are for illustrative purposes only, and are not to be construed as limiting the present disclosure, which are just examples of embodiments of the present disclosure. Conventional structures or configurations will be omitted when it may cause confusion to the understanding of the present disclosure. It should be noted that the shapes and sizes of the various components in the drawings do not reflect true sizes and proportions thereof, but merely illustrate the contents of the embodiments of the present disclosure.

Technical or scientific terms used in the embodiments of the present disclosure should be of ordinary meaning as understood by a person of ordinary skill in the art, unless otherwise defined. Such terms as "first", "second" and similar words used in the embodiments of the present disclosure do not represent any order, quantity, or importance, but are merely used to distinguish different components.

Further, in the description of the embodiments of the present disclosure, such terms as "coupled" or "coupled" may mean that two components are directly coupled or coupled, or that two components are coupled via one or more other components. In addition, the two components can be coupled or coupled in a wired or wireless manner.

Further, in the description of the embodiments of the present disclosure, technical terms or scientific terms used in the present disclosure should be in the ordinary meaning as understood by a person of ordinary skill in the art, unless otherwise defined.

At present, the reset function of each sub-pixel unit of an array substrate in the related art is performed separately, and a TFT and a reset signal line needs to be arranged or laid out for each pixel unit, which is not conducive to saving space, and thus cannot improve the PPI within a limited layout space.

In view of the above-mentioned problem, the present disclosure proposes an array substrate, a display panel and a display device, to solve the technical problem in the related art of a waste of space or a limited PPI in a limited layout space.

The technical solutions of the present disclosure and how the technical solutions of the present disclosure solve the above technical problems will be described in detail below with specific embodiments.

An embodiment of the present disclosure provides an array substrate. As shown in FIG. 1, the array substrate includes a base substrate 1120 and a plurality of sub-pixel units 100 arranged in an array on the base substrate 1120.

Optionally, referring to FIG. 1, a block structure of two adjacent sub-pixel units 100 is shown, and each sub-pixel unit 100 includes a pixel circuit structure and a light-emitting element 120. The pixel circuit structure includes a driving transistor 111, a first reset transistor 112 and a second reset transistor 113.

Figure 9:
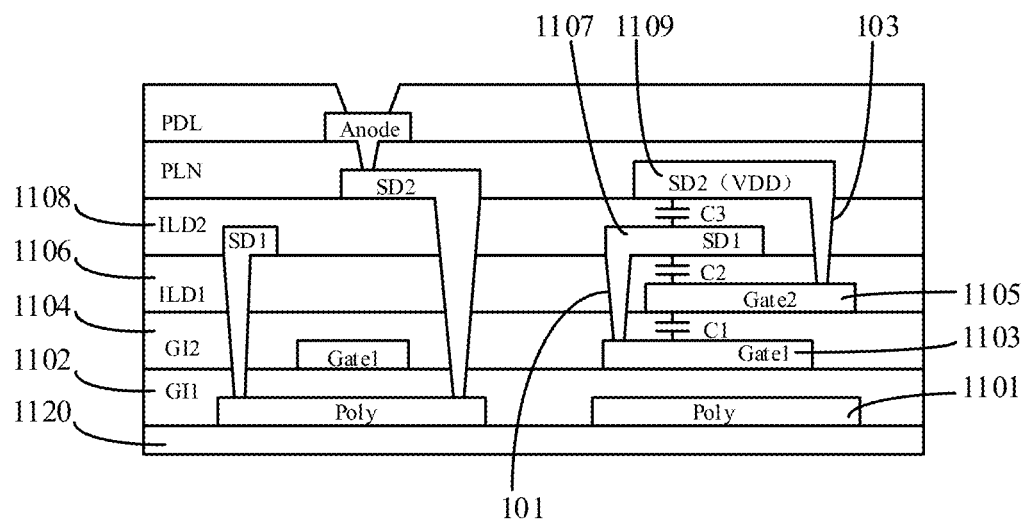
FIG. 9 is a schematic diagram of a film structure of a pixel circuit structure of an array substrate corresponding to the schematic diagram of the film structure shown in FIG. 7 according to an embodiment of the present disclosure.
Figure 10:
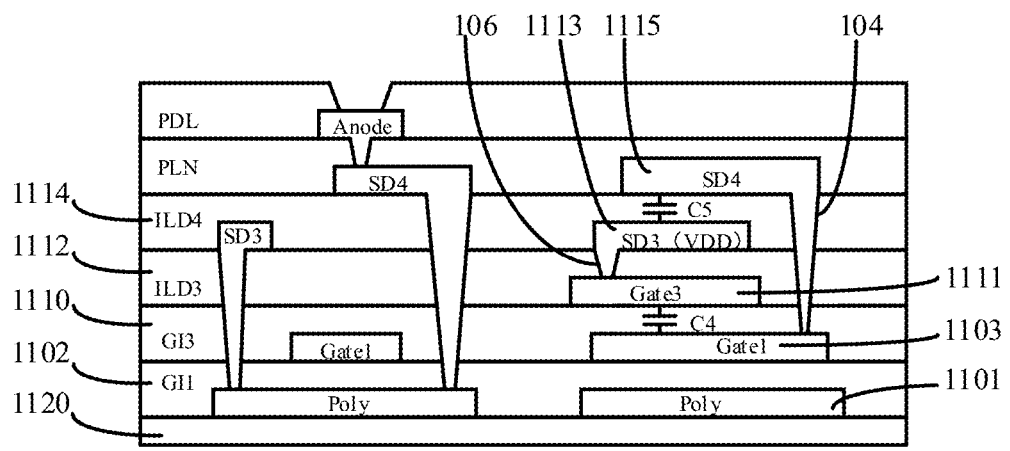
FIG. 10 is a schematic diagram of a film structure of a pixel circuit structure of an array substrate corresponding to the schematic diagram of the film structure shown in FIG. 8 provided by another embodiment of the present disclosure.

Optionally, referring to FIG. 9 and FIG. 10, each transistor includes: an active structure 1101 on a base substrate 1120, a first insulating structure 1102 on the active structure 1101, and a first metal layer structure 1103 on the first insulating structure 1102.

Figure 2:
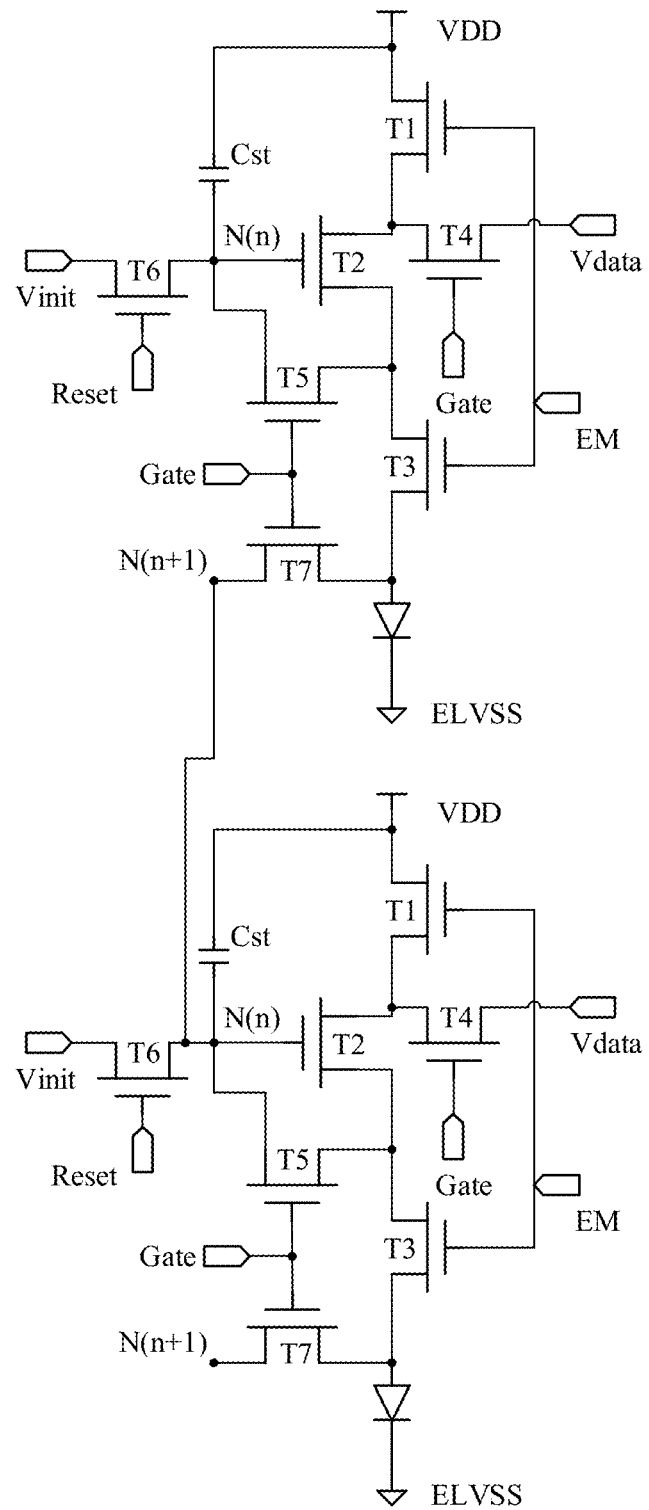
FIG. 2 is a schematic diagram of an equivalent circuit of an i-th row of sub-pixel unit and an (i+1)-th row of sub-pixel unit of a pixel circuit structure of an array substrate provided by an embodiment of the present disclosure.

FIG. 2 is a schematic diagram of equivalent circuits of an i-th row of sub-pixel unit and an (i+1)-th row of sub-pixel unit of a pixel circuit structure of an array substrate provided by an embodiment of the present disclosure. The driving transistor is a transistor T2 in FIG. 2, the first reset transistor includes a transistor T7 in FIG. 2, and the second reset transistor includes a transistor T6 in FIG. 2.

Optionally, in conjunction with FIG. 1 and FIG. 2, the active structure 1101 of the first reset transistor 112 of the i-th row of sub-pixel unit 100 (i.e., a first electrode of the transistor T7 shown in FIG. 2) is electrically coupled to an anode of the light-emitting element 120 of the i-th row of sub-pixel unit 100, and is electrically coupled to the active structure 1101 of the second reset transistor 113 of the (i+1)-th row of sub-pixel unit 100 (i.e., a first electrode of the transistor T6 shown in FIG. 2), where i is an integer greater than 0. In each of the sub-pixel units, the first metal layer structure 1103 of the driving transistor 111 (i.e., a gate electrode of the transistor T2 in FIG. 2) is electrically coupled to the active structure 1101 of the second reset transistor 113 (a first electrode of the transistor T6 shown in FIG. 2).

Figure 7:
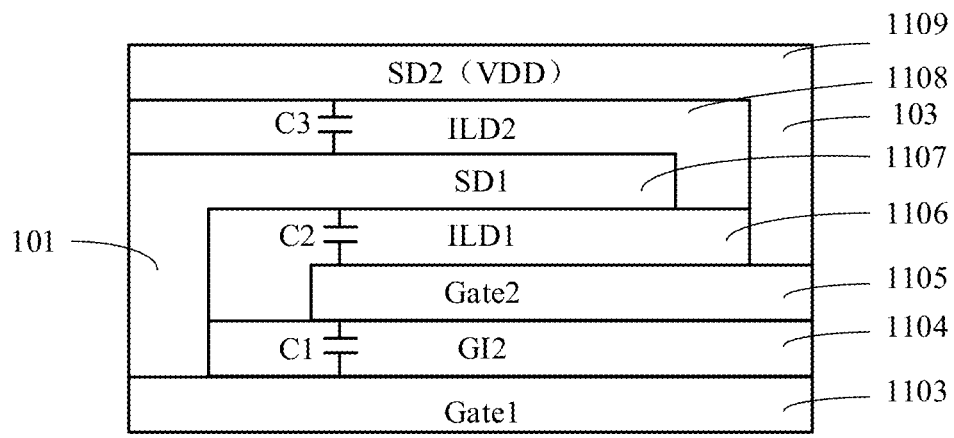
FIG. 7 is a schematic diagram of a film structure of a pixel circuit structure of an array substrate provided by an embodiment of the present disclosure, which illustrates a structure with three capacitors being in parallel.

Optionally, the first metal layer structure 1103 of each transistor is used as a gate structure of each transistor (for example, as shown in FIG. 7, it is abbreviated as Gate1). One first metal layer structure 1103 includes a gate structure of at least one transistor, and the gate structure serves as a gate electrode of the transistor.

Figure 4:
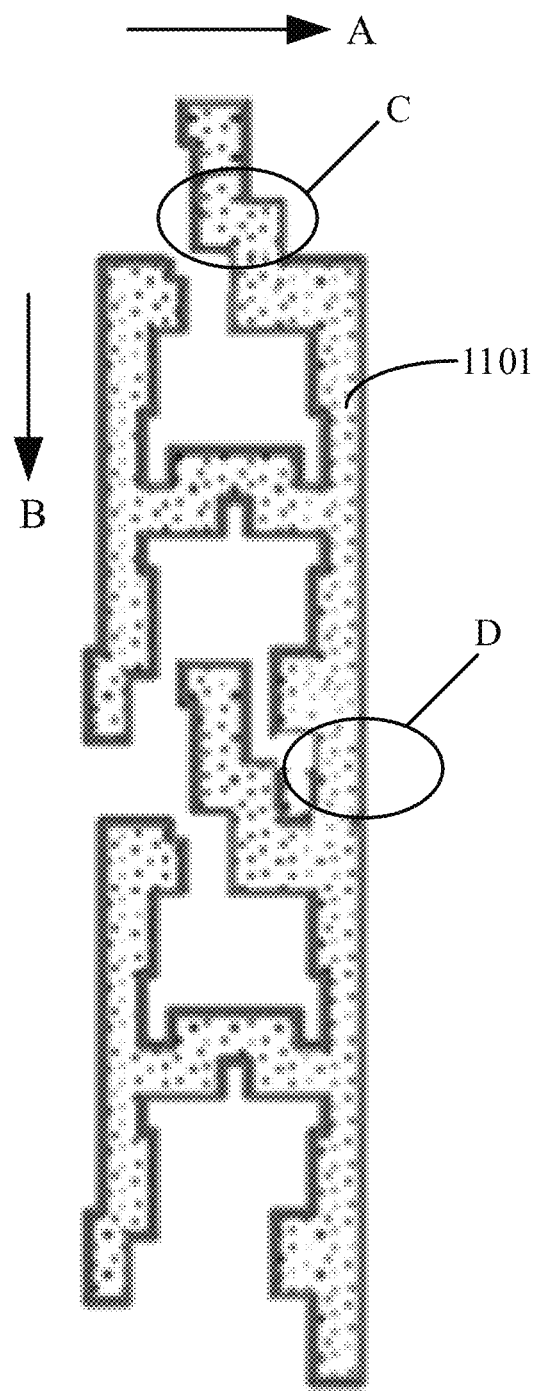
FIG. 4 is a schematic structural diagram of an active structure of a pixel circuit structure of an i-th row of sub-pixel unit and an (i+1)-th row of sub-pixel unit provided by an embodiment of the present disclosure.
Figure 5:
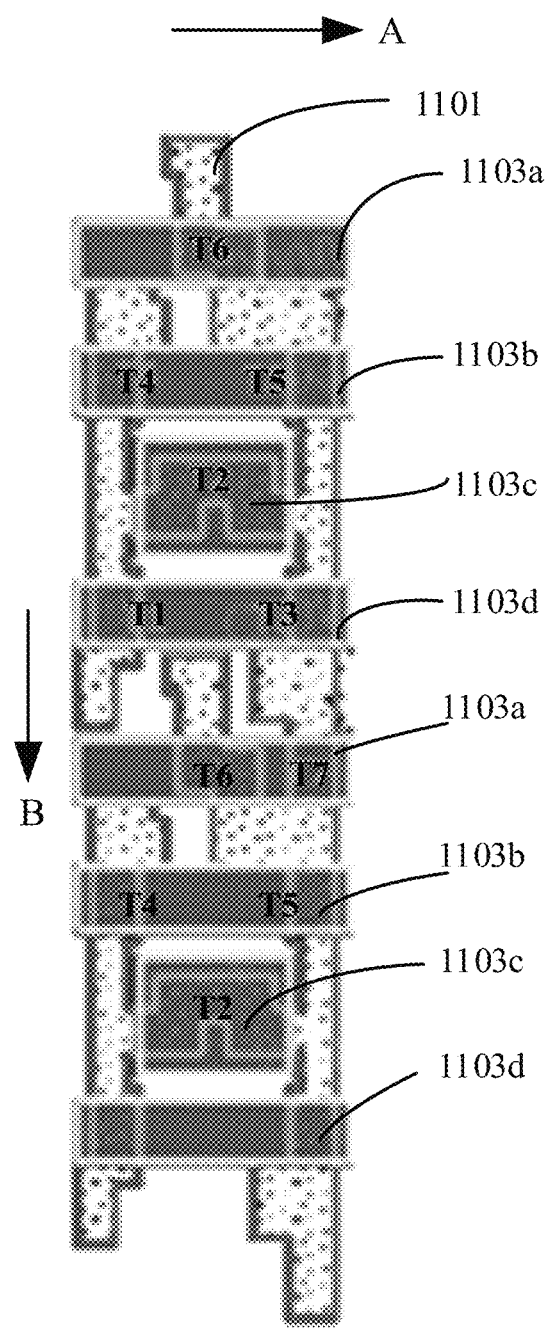
FIG. 5 is a schematic structural diagram of an active structure and a first metal layer structure of a pixel circuit structure of an i-th row of sub-pixel unit and an (i+1)-th row of sub-pixel unit provided by an embodiment of the present disclosure.
Figure 6:
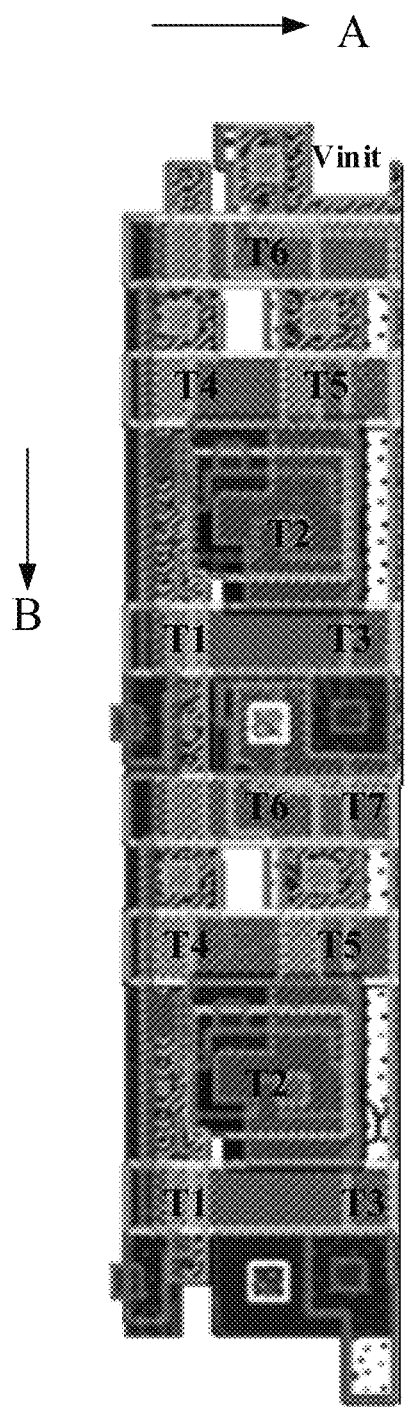
FIG. 6 is a schematic structural diagram of a pixel circuit structure of an i-th row of sub-pixel unit and an (i+1)-th row of sub-pixel unit provided by an embodiment of the present disclosure.

Referring to FIG. 4 to FIG. 6, a first direction is a horizontal direction shown by an arrow A, and a second direction is a vertical direction shown by an arrow B. A plurality of sub-pixel units 100 are arranged along the first direction A to form a row of sub-pixel units 100. A plurality of sub-pixel units 100 are arranged along the second direction B to form a column of sub-pixel units 100. Multiple rows of sub-pixel units 100 are arranged along the second direction B to form a plurality of sub-pixel units 100 arranged in an array with multiple rows and multiple columns. As shown in FIG. 2, an i-th row of sub-pixel unit 100 is any row of sub-pixel units extending along the first direction A, and an (i+1)-th row of sub-pixel unit 100 is next to and adjacent to the i-th row of sub-pixel unit 100 in the second direction B, where i is a positive integer.

The electrical connection of transistors in the pixel circuit structure according to the embodiments of the present disclosure enables the second reset transistor 113 in the (i+1)-th row to be coupled to the anode of the light-emitting element 120 in the i-th row through the first reset transistor 112 in the i-th row, which achieves that a gate electrode of the driving transistor 111 in the (i+1)-th row and the anode of the light-emitting element 120 in the i-th row are reset at the same time.

Optionally, FIG. 2 shows a circuit diagram corresponding to a pixel circuit structure in two adjacent rows of an array substrate, where the driving transistor 111 is specifically a switching component T2, the first reset transistor 112 is specifically a switching component T7, and the second reset transistor 113 is specifically a switching component T6. Control electrodes of the switching component T6 in the i-th row and the switching component T6 in the (i+1)-th row are electrically coupled to a reset control signal line Reset, and first electrodes of the switching component T6 in the i-th row and the switching component T6 in the (i+1)-th row are used to receive a reset signal Vinit. A second electrode of the switching component T6 in the (i+1)-th row is electrically coupled to a control electrode of the switching component T2 in the (i+1)-th row and a first electrode of the switching component T7 in the i-th row. A second electrode of the switching component T7 in the i-th row is electrically coupled to an anode of the light-emitting element 120 in the i-th row.

Optionally, referring to FIG. 2, the light-emitting element 120 may be an OLED device, which may be used to internally compensate a pixel structure of an OLED back plate. The light-emitting element 120 may also adopts the quantum dot display technology, for example, a quantum dot light-emitting diode (QLED) is used.

Optionally, FIG. 2 shows an equivalent circuit diagram of the i-th row of sub-pixel unit and the (i+1)-th row of sub-pixel unit. Each row of sub-pixel units 100 includes seven switching components and a capacitor Cst. The switching components are switching components T1 to T7. Reference signs Vinit, Reset, Gate, EM and Vdata respectively indicate a reset signal line, a reset control signal line, a gate signal line, a light-emitting control signal line, a data signal line, which output a reset signal ($V_{init}$), a reset control signal ($V_{Reset}$), a gate signal (gate), light-emitting signal ($V_{EM}$) and data signal ($V_{data}$), respectively. Reference signs N(n) and N(n+1) represent electrical connection nodes, and reference signs VDD and ELVSS represent power supply lines, which output different voltages.

The anode of the light-emitting element in the i-th row coupled and the second electrode of the switching component T6 in the (i+1)-th row are electrically coupled through the switching component T7 in the i-th row, and both of them are controlled by a gate signal (gate) at the gate electrode of the switching component T7 in the i-th row and a reset control signal $V_{Reset}$ of the (i+1)-th row, so that the two components can be combined into one element in the process of wiring. When the gate signal (gate) outputted by the Gate is at an active level, the reset signal $V_{init}$ outputted by Vinit may reset a potential of the gate electrode of the switching component T2 in the (i+1)-th row via the switching component T6 in the (i+1)-th row, and may simultaneously reset a potential of the anode of the light-emitting element in the i-th row via the switching component T7 in the i-th row.

Figure 3:
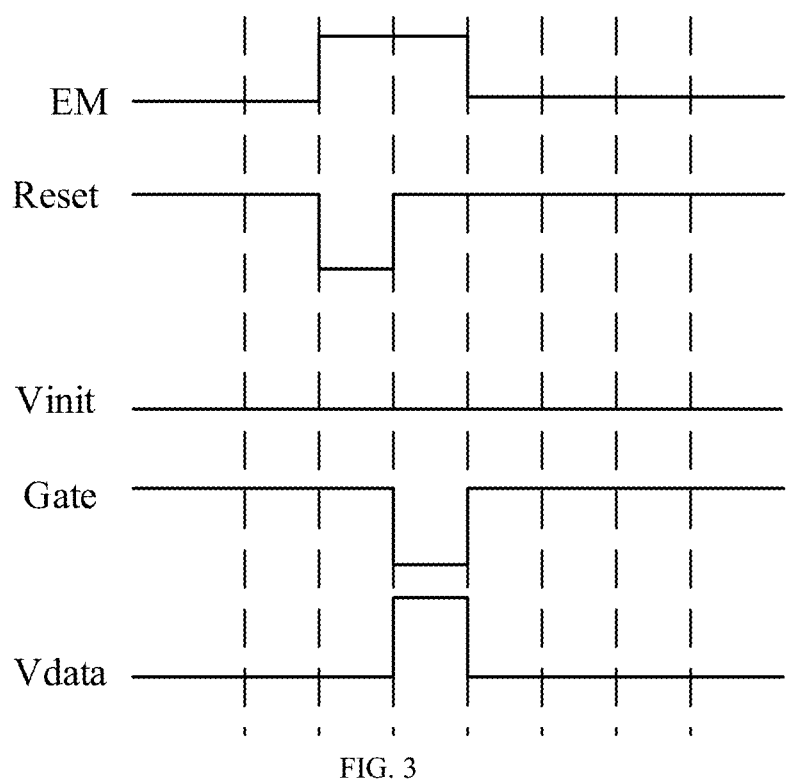
FIG. 3 is a timing diagram of multiple signals of the equivalent circuit in FIG. 2.

Optionally, in conjunction with FIG. 2 and FIG. 3, a working process of the equivalent circuit corresponding to the pixel circuit structure of the embodiment of the present disclosure is introduced as an example.

In a first period t1, the gate electrode of the switching component T6 in the (i+1)-th row receives a reset control signal $V_{Reset}$ outputted by the reset control signal line (Reset), the switching component T6 the (i+1)-th row is turned on, the first electrode of the switching component T6 in the (i+1)-th row receives a high-level reset signal $V_{init}$ outputted by Vinit, and the second electrode of the switching component T6 in the (i+1)-th row outputs the reset signal $V_{init}$ to the gate electrode of the switching component T2 in the (i+1)-th row and a first electrode plate of the capacitor Cst in the (i+1)-th row, as an initialization voltage, which initializes the gate electrode of the switching component T2 and the capacitor Cst in the (i+1)-th row. At the same time, the gate signal line (Gate) is inputted with an active level (for example, a high level), the switching component T7 in the i-th row is turned on, and the reset signal $V_{init}$ outputted by the second electrode of the switching component T6 in the (i+1)-th row reset a potential of the anode of the light-emitting element in the i-th row via the turned-on switching component T7. Signals outputted by the reset control signal line (Reset) in the (i+1)-th row and the gate signal line (Gate) in the i-th row are a same timing signal, which are at a high level.

In a second period t2, the gate signal outputted by the Gate is at an active level (i.e., the high level), the switching component T5 and the switching component T4 in the i-th row are turned on under the control of the gate signal, and the Vdata signal is applied to the gate electrode of the switching component T2, so that the voltage applied to the gate electrode of the switching component T2 is a compensation voltage $V_{data}+V_{th}$, where $V_{th}$ is a threshold voltage of the switching component T2. At the same time, the compensation voltage applied to the gate electrode of the switching component T2 is also applied to the first electrode plate of the capacitor Cst. Subsequently, the voltage $V_{DD}$ of VDD is applied to the second electrode plate of the capacitor Cst, and the compensation voltage $V_{data}+V_{th}$ is applied to the first electrode plate of the capacitor Cst, so that electric charges corresponding to a difference between the voltages applied to the two electrode plates of the capacitor Cst are stored in the capacitor Cst, the switching component T2 is turned on for a predetermined time. The capacitor Cst is used to maintain the stability of the potential $V_{data}+V_{th}$ of the switching component T2.

In a third period t3, the light-emitting signal ($V_{EM}$) outputted by a light-emitting control signal line EM is at an active level (i.e., the high level), the switching component T1 and the switching component T3 in the i-th row are turned on, and the voltage VDD is applied to the switching component T2 through the switching component T1. The voltage VDD passes through the turned-on switching component T2 and the turned-on switching component T3, and is further applied to the anode of the light-emitting element 120 to drive the light-emitting element 120 to emit light.

Optionally, referring to FIG. 2, each switching component is a thin film transistor, and the control electrode of each switching component is a gate electrode of the thin film transistor. If the first electrode of each switching component is the source electrode of the thin film transistor, the second electrode of each switching component is the drain electrode of the thin film transistor. If the second electrode of each switching component is the source electrode of the thin film transistor, the first electrode of each switching component is the drain electrode of the thin film transistor. If the switching component is an N-type TFT, the control electrode of the switching component is turned on by a high-level signal; if the switching component is a P-type TFT, the control electrode of the switching component is turned on by a low-level signal.

Transistors used in the embodiments of the present disclosure may each be a thin film transistor, or a field effect transistor, or other devices having the same characteristics. Optionally, the thin film transistor used in the embodiments of the present disclosure may be an oxide semiconductor transistor. Since a source electrode and a drain electrode of the thin film transistor used herein are symmetrical, the source electrode and the drain electrode thereof can be interchanged. In the embodiments of the present disclosure, one of the source electrode and the drain electrode is referred to as a first electrode, and the other of the source electrode and the drain electrode is referred to as a second electrode. In the following examples, an N-type thin film transistor is taken as an example for description. A person of ordinary skill in the art may appreciate that the embodiments of the present disclosure are also applicable to the case of P-type thin film transistors. When a transistor is an N-type transistor, a voltage for turning on the transistor (referred to as a turn-on voltage) is a high level voltage (for example, 5V, 10V, or other suitable voltage), and a voltage for turning off the transistor (referred to as a turn-off voltage) is a low level voltage (for example, 0V, −5V, −10V, or other suitable voltage).

As an example, FIG. 4 shows an active structure 1101 of the i-th row of sub-pixel unit 100 and the (i+1)-th row of sub-pixel unit 100, which matches the circuit diagram of FIG. 2, where two rows of sub-pixel units 100 are shown in the first direction A, and one column of sub-pixel units 100 is shown in the second direction B. In FIG. 4, part C is the active structure 1101 of the second reset transistor 113 (i.e., the switching component T6), and in the second direction B, part D is the active structure 1101 of the first reset transistor 112 (i.e., the switching component T7). The active structure 1101 of the first reset transistor 112 of the sub-pixel unit 100 in the i-th row is adjacent to the active structure 1101 of the second reset transistor 113 of the sub-pixel unit 100 in the (i+1)-th row.

Figure 14A:
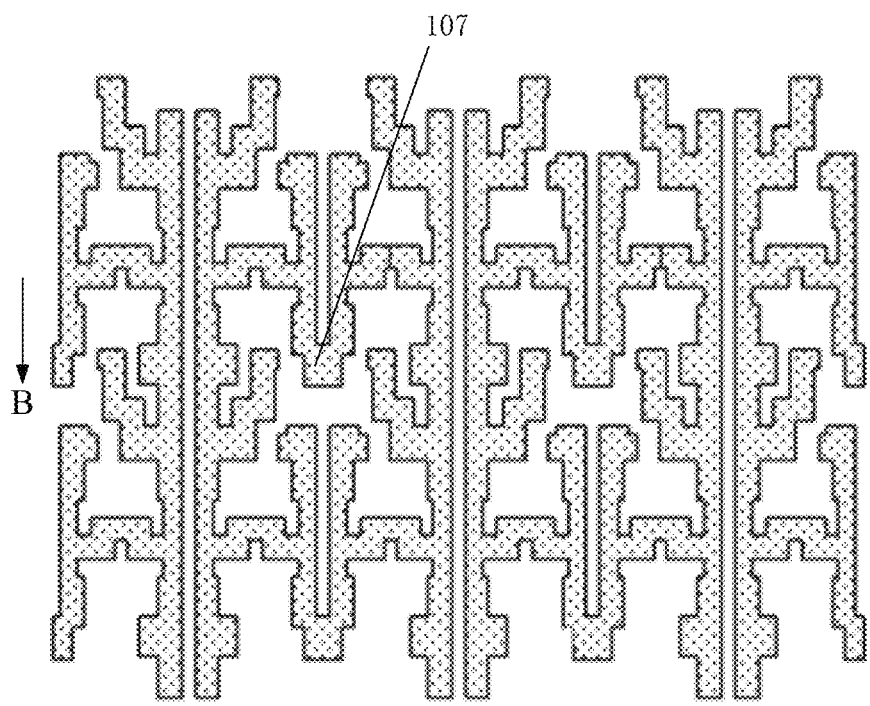
FIGS. 14a to 14g are schematic diagrams sequentially showing a first active layer, a first metal layer, a second metal layer, a first interlayer dielectric layer, a third metal layer, a second interlayer dielectric layer, and a fourth metal layer of one sub-pixel unit of an array substrate provided by an embodiment of the present disclosure, after the manufacture of each film has been completed, which show a structure of three capacitors forming a parallel structure.
Figure 14B:
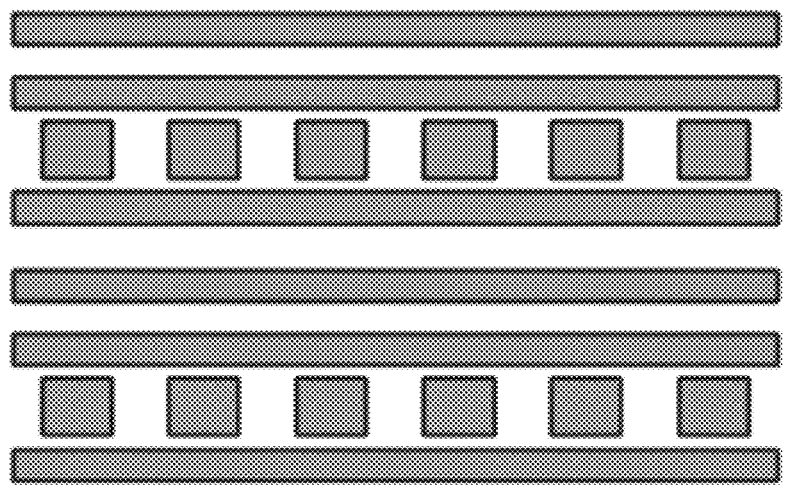

As an example, FIG. 5 and FIG. 14b are schematic diagrams illustrating that the active structure 1101 and a first metal layer structure 1103 of the first metal layer 1003 in the i-th row of sub-pixel unit 100 and the (i+1)-th row of sub-pixel unit 100 form multiple switching components, which specifically shows switching components T1 to T7 in the i-th row of sub-pixel unit 100 and switching components T1 to T7 the (i+1)-th row of sub-pixel unit 100. Specifically, referring to FIG. 12b, a first metal layer 1003 of one sub-pixel unit 100 includes a first metal structure 1103a of the first metal layer 1003, a second metal structure 1103b of the first metal layer 1003, a third metal structure 1103c of the first metal layer 1003, and a fourth metal structure 1103d of the first metal layer 1003 arranged along the second direction B. All the first metal structure 1103a of the first metal layer

1003, the second metal structure 1103*b* of the first metal layer 1003, the third metal structure 1103*c* of the first metal layer 1003, and the fourth metal structure 1103*d* of the first metal layer 1003 belong to the first metal layer structure 1103.

Figure 12A:
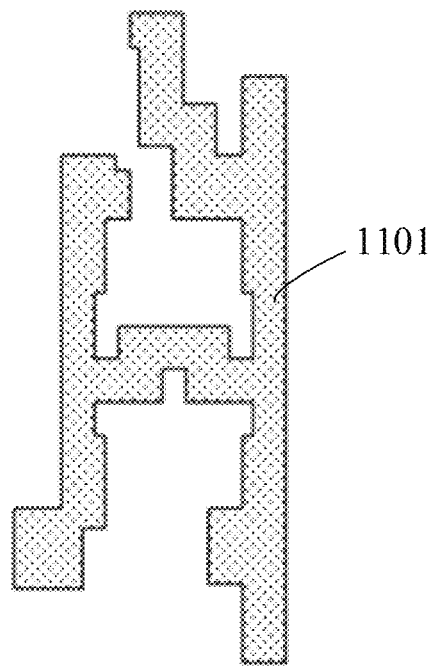
FIGS. 12a to 12g are schematic diagram sequentially showing a first active layer, a first metal layer, a second metal layer, a first interlayer dielectric layer, a third metal layer, a second interlayer dielectric layer, and a fourth metal layer of one sub-pixel unit after the manufacture of each film has been completed, which illustrates a structure with three capacitors being in parallel.
Figure 12B:
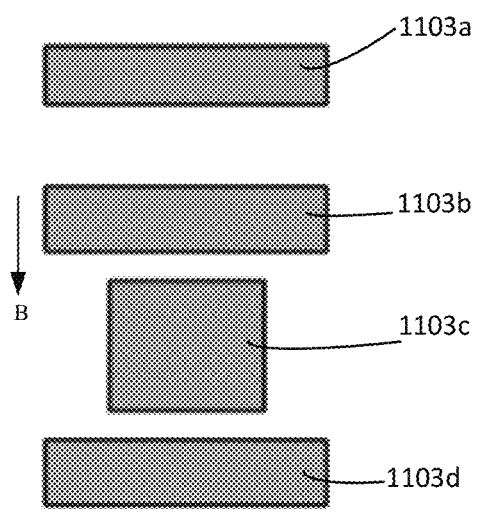

Optionally, referring to FIG. 5 and FIG. 12*b*, there is a bent structure in a part of the active structure 1101 of the switching component T6 corresponding to the first metal structure 1103*a* of the first metal layer (that is, a part of the switching component T6 that shields the first metal structure 1103*a* of the first metal layer, or an overlapping part where an orthographic projection of the switching component T6 onto a base substrate 1120 overlaps an orthographic projection of the first metal structure 1103*a* onto the base substrate 1120). The switching component T6 increases the transistor length L in a limited space, which is conductive to reduce the gate leakage of the switching component T2. At the same time, the width-to-length ratio of a channel of the switching component T6 is reduced, which reduces the load of the switching component, and reduces a driving current.

Optionally, referring to FIG. 5, in the second direction B, an orthographic projection of the first electrode of the switching component T7 onto the base substrate overlaps an orthographic projection of the second electrode of the switching component T5 onto the base substrate, which can make an active layer pattern of the active structure 1101 more compact and reduce the area of the pixel circuit structure, thereby improving the PPI.

As an example, FIG. 6 shows a pixel circuit structure of the i-th row of sub-pixel unit 100 and the (i+1)-th row of sub-pixel unit 100 that match the circuit diagram of FIG. 2. As shown in FIG. 1, FIG. 5 and FIG. 6, the first reset transistor 112 (i.e., the switching component T7) is formed at a corresponding positon between the anode of the light-emitting element 120 of the i-th row of sub-pixel unit 100 and the first metal layer structure 1103 of the driving transistor 111 (i.e., the switching component T2) of the (i+1)-th row, which decreases the number of via holes, thereby saving the layout space and improving the PPI.

Optionally, referring to FIG. 5 and FIG. 6, the active structure 1101 of the switching component T6 is electrically coupled to the reset signal line Vinit through a via hole. Compared with a structure in the related art that requires two via holes and a bridge structure to connect the switching component T6 and the reset signal line Vinit, the number of via holes can be reduced, and patterns are more compact, which reduces the area of the pixel circuit structure, and further improves the PPI.

Optionally, referring to FIG. 5 and FIG. 6, in the second direction B, the via hole for electrically connecting the active structure 1101 of the switching component T6 to the first metal layer structure 1103 of the switching component T2 and the via hole for electrically connecting the active structure 1101 of the switching component T6 to the reset signal line Vinit are located on two sides (i.e., the upper and lower sides) of the gate signal line of the switching component T6. By adopting this arrangement form in the embodiments of the present disclosure, a distance between the two via holes is relatively long, and short circuit defects such as overlapped holes are effectively avoided.

Optionally, referring to FIG. 5 and FIG. 6, the reset signal line Vinit extends along the second direction B, and is electrically coupled to the active structure 1101 of the switching component T6 through an electrical connection structure in a horizontal direction.

In some embodiments, referring to FIG. 7, the sub-pixel unit 100 further includes a second insulating structure 1104, a second metal layer structure 1105, a first interlayer dielectric layer structure 1106, and a third metal layer structure 1107, which are stacked. The second insulating structure 1104 is located on the first metal layer structure 1103.

Optionally, referring to FIG. 1 and FIG. 7, the sub-pixel unit 100 further includes a first metal layer structure 1103, and the second insulating structure 1104 is in contact with the first metal layer structure 1103. The first metal layer structure 1103 in FIG. 7 may be used as the first metal layer structure 1103 of the driving transistor 111.

Optionally, referring to FIG. 5 and FIG. 7, in the sub-pixel unit 100, the first metal layer structure 1103 of the driving transistor 111 is electrically coupled to a first end of the third metal layer structure 1107 of the sub-pixel unit 100. A second end of the third metal layer structure 1107 (for example, the third metal layer structure 1107 may be a reset signal line Vinit) is electrically coupled to the active structure 1101 of the second reset transistor 113 (i.e., the first electrode of the transistor T6 shown in FIG. 2). That is, the first metal layer structure 1103 of the driving transistor 111 is electrically coupled to the active structure 1101 of the second reset transistor 113 through the third metal layer structure 1107. As shown in FIG. 7, the first end of the third metal layer structure 1107 is located on the left side of the third metal layer structure 1107, and the second end is located on the right side of the third metal layer structure 1107.

In some embodiments, referring to FIG. 7, FIG. 9, and FIGS. 12*a* to 12*g*, an orthographic projection of the first end of the third metal layer structure 1107 onto the base substrate 1120 of the sub-pixel unit 100 at least partially overlaps an orthographic projection of the first metal layer structure 1103 of the driving transistor 111 onto the base substrate 1120, and a first via hole 101 is provided in the second insulating structure 1104 and the first interlayer dielectric layer structure 1106 at the overlapped area. The first end of the third metal layer structure 1107 is electrically coupled to the first metal layer structure 1103 of the driving transistor 111 through the first via hole 101. For example, the first metal layer structure 1103 of the driving transistor 111 is the gate electrode of the transistor T2 in FIG. 2, the third metal layer structure 1107 serves as an electrode plate of a capacitor Cst in FIG. 2, and the gate electrode of the transistor T2 is connected to the electrode plate of a capacitor Cst, which is as shown in FIG. 2. Optionally, referring to FIG. 12*c*, FIG. 12*d*, FIG. 12*e*, FIG. 13*c* and FIG. 4, the third metal layer 1007 includes a plurality of third metal layer structures 1107, and the plurality of third metal layer structures 1107 includes a first metal structure 1107*a* of the third metal layer 1007, a second metal structure 1107*b* of the third metal layer 1007 and a third metal structure 1107*c* of the third metal layer 1007. A first end of the second metal structure 1107*b* of the third metal layer 1007 is electrically coupled to the first metal layer structure 1103 of the driving transistor 111 through the first via hole 101.

Figure 12C:
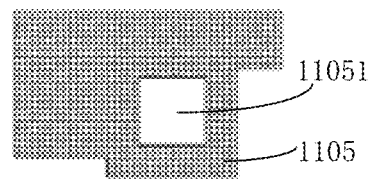
Figure 12D:
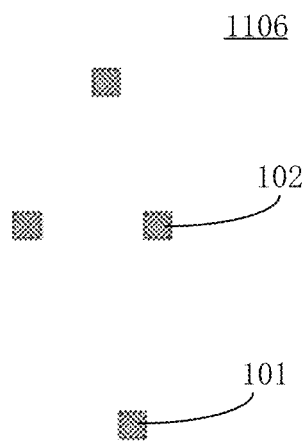

In some embodiments, referring to FIG. 12*d*, an orthographic projection of the second end of the third metal layer structure 1107 onto the base substrate 1120 at least part overlaps an orthographic projection of the active structure 1101 of the second reset transistor 113 onto the base substrate 1120, a second via hole 102 is provided in the first insulating structure 1102, the second insulating structure 1104 and the first interlayer dielectric layer structure 1106 at the overlapped area. The second end of the third metal layer structure 1107 is electrically coupled to the active structure 1101 of the second reset transistor 113 through the second via hole 102. For example, the third metal layer structure 1107 serves as the electrode plate of the capacitor Cst in FIG. 2, the active structure 1101 of the second reset transistor 113 is the first electrode of the transistor T6 shown in FIG. 2, and as shown in FIG. 2, the electrode plate of the capacitor Cst is connected to the first electrode of the transistor T6. Optionally, referring to FIGS. 12d, 12e and 13c, the second end of the second metal structure 1107b of the third metal layer 1007 is electrically coupled to the active structure 1101 of the second reset transistor 113 through the second via hole 102.

In some embodiments, referring to FIG. 7, the sub-pixel unit 100 further includes a second interlayer dielectric layer structure 1108 located on the third metal layer 1007 and a fourth metal layer structure 1109 located on the second interlayer dielectric layer structure 1108.

Referring to FIG. 7, a third via hole 103 is arranged in the first interlayer dielectric layer structure 1106 and the second interlayer dielectric layer structure 1108. The fourth metal layer structure 1109 is electrically coupled to the second metal layer structure 1105 through the third via hole 103.

Optionally, referring to FIG. 7, a shape and a position of the third via hole 103 in FIG. 7 only schematically indicates that the fourth metal layer structure 1109 is electrically coupled to the second metal layer structure 1105 through the third via hole 103, and the third via hole 103 may be located in a display area, or may be located in a peripheral blank area (dummy area). FIG. 12f is a schematic structural diagram of the second interlayer dielectric layer structure 1108 of the sub-pixel unit 100. The second interlayer dielectric layer structure 1108 is a structure with a relatively high transparency. The via holes in FIG. 12f are an example of a via hole for electrical connection between structures that can be set in practical applications. In this embodiment, the third via hole 103 is located in the peripheral blank area (dummy area), so the third via hole 103 is not arranged in the second interlayer dielectric layer structure 1108 of the sub-pixel unit 100.

In some embodiments, in each sub-pixel unit 100, one first metal layer structure 1103 of the sub-pixel unit 100 includes the first metal layer structure 1103 of the driving transistor 111.

Optionally, referring to FIG. 7 and FIGS. 12a to 12g, each sub-pixel unit 100 further includes a second insulating structure 1104, a second metal layer structure 1105, a first interlayer dielectric layer structure 1106, a third metal layer structure 1107, a second interlayer dielectric layer structure 1108 and a fourth metal layer structure 1109, which are stacked on the first metal layer structure 1103.

Referring to FIG. 7 and FIG. 9, an orthographic projection of the second metal layer structure 1105 onto the base substrate 1120 partially overlaps with an orthographic projection of the first metal layer structure 1103 onto the base substrate 1120, and a first capacitor C1 is formed between the second metal layer structure 1105 and the first metal layer structure 1103 at the overlapping area of the orthographic projections.

An orthographic projection of the third metal layer structure 1107 onto the base substrate 1120 partially overlaps with an orthographic projection of the second metal layer structure 1105 onto the base substrate 1120, and a second capacitor C2 is formed between the third metal layer structure 1107 and the second metal layer structure 1105 at the overlapping part of the orthographic projections.

An orthographic projection of the fourth metal layer structure 1109 onto the base substrate 1120 partially overlaps with an orthographic projection of the third metal layer structure 1107 onto the base substrate 1120, and a third capacitor C3 is formed between the fourth metal layer structure 1109 and the third metal layer structure 1107 at the overlapping part of the orthographic projections.

In some embodiments, the third metal layer structure 1107 serves as a reset signal line, and is used to receive a reset signal.

The fourth metal layer structure 1109 serves as a power supply line, and is used to receive a power supply voltage.

Optionally, the first metal layer structure 1103 is a gate structure.

As an example, referring to FIG. 7, in an embodiment, the first metal layer structure 1103 is Gate1 (gate layer), the second insulating structure 1104 is GI2 (gate insulating layer), the second metal layer structure 1105 is Gate2, the first interlayer dielectric layer structure 1106 is ILD1 (interlayer dielectric layer), the third metal layer structure 1107 is SD1 (which may be used as a metal signal line layer or source-drain layer), the second interlayer dielectric layer structure 1108 is ILD2, and the fourth metal layer structure 1109 is SD2 (which may include a VDD structure, serve as a power supply line to provide a power supply voltage). A part of the third metal layer structure 1107 is filled in the first via hole 101, and a part of the fourth metal layer structure 1109 is filled in the third via hole 103. Each of the second insulating structure 1104, the first interlayer dielectric structure 1106 and the second interlayer dielectric structure 1108 is an insulating layer. The first capacitor C1, the second capacitor C2, and the third capacitor C3 form a parallel structure, thereby obtaining a larger storage capacitor in a limited layout space and improving the voltage stabilization capability.

As an example, referring to FIG. 9, the structure with three capacitors shown in FIG. 7 is adopted. An active layer is provided on a side of the base substrate 1120. The active layer may be a poly layer (polysilicon layer), and the active layer includes an active structure 1101. The active structure 1101 may be a poly structure, and the first insulating structure 1102 is GI1 (gate insulating layer). The source and drain electrodes of the driving transistor 111 are formed by the Poly layer, and Gate1 is a gate electrode. Gate2 is an electrode plate of a capacitor, and may be used as some signal lines at the same time. SD1 is the other electrode plate of the capacitor, and is electrically coupled to the gate electrode (Gate1) of the driving transistor 111 through the via hole of GI2 and ILD1. Furthermore, SD1 may be also used as a data signal line, a reset signal line Vinit, and SD2 is used as a power supply line, and is electrically coupled to Gate2 through the via hole of ILD1 and ILD2. In such a manner, a structure of three capacitors in which a first capacitor C1, a second capacitor C2, and third capacitor C3 are connected in parallel is formed.

In an embodiment, an electrical connection structure of the switching component is also provided. The source and drain electrodes may be a metal layer structure. A PLN (Planarization) layer is prepared on a side of SD2 away from ILD2, and a via hole is arranged in the PLN layer. An anode layer (Anode) is arranged on a side of the PLN layer away from SD2, and the anode layer is electrically coupled to SD2 through the via hole. A PDL layer (Pixel Define Layer) is arranged on a side of the anode layer away from the PLN layer, an opening is disposed in the PDL layer, and a light-emitting layer is prepared on a side of the PDL layer away from the anode layer.

As an example, FIGS. 12a to 12g schematically and sequentially show the first active layer 1001a, the first metal layer 1003, the second metal layer 1005, the first interlayer dielectric layer 1006, the third metal layer 1007, the second interlayer dielectric layer 1008, and the fourth metal layer 1009 of one sub-pixel unit 100, after they have been prepared. The sub-pixel unit 100 according to the embodiment of the present disclosure forms a structure of three capacitors in which a first capacitor C1, a second capacitor C2, and third capacitor C3 are connected in parallel. The first insulating layer 1002 and the second insulating layer 1004 corresponding to the first insulating structure 1102 and the second insulating structure 1104 are both film layers with high transparency.

Optionally, in conjunction with FIG. 12a and FIG. 14a, FIG. 12a shows the active structure 1101 of the first active layer 1001a of one sub-pixel unit 100.

Optionally, in conjunction with FIG. 12b and FIG. 14b, FIG. 12b shows a plurality of first metal layer structures 1103 of the first metal layer 1003 of a sub-pixel unit 100, which are arranged along the second direction B. The plurality of first metal layer structures 1103 includes a first metal structure 1103a of the first metal layer 1003, a second metal structure 1103b of the first metal layer 1003, a third metal structure 1103c of the first metal layer 1003, and a fourth metal structure 1103d of the first metal layer 1003.

Figure 14C:
Figure 14C:

Optionally, in conjunction with FIG. 12c and FIG. 14c, FIG. 12c shows a second metal layer structure 1105 of a second metal layer 1005 of a sub-pixel unit 100, and the second metal layer structure 1105 is provided with a first opening 11051, which is conductive to make the second metal layer structure 1105 and the first via hole 101 to be separated and insulated from each other.

Figure 14D:
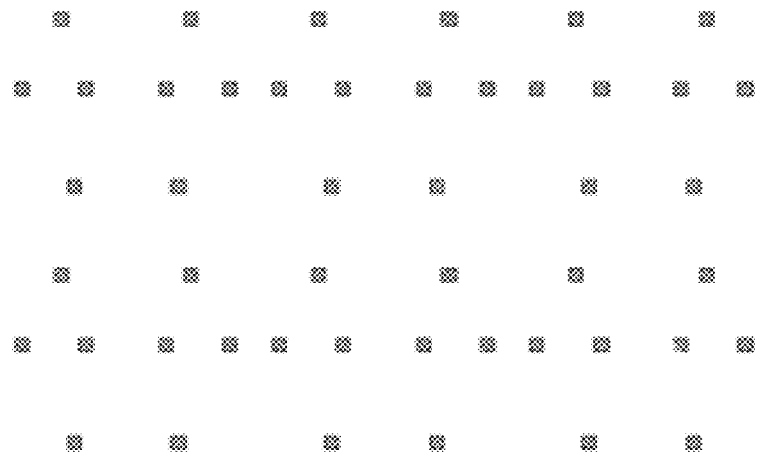

Optionally, referring to FIG. 12d and FIG. 14d, the first interlayer dielectric layer structure 1106 of the first interlayer dielectric layer 1006 of a sub-pixel unit 100 is shown. The first interlayer dielectric layer 1006 has a relatively high transparency. A first via hole 101 and a second via hole 102 are disposed in the first interlayer dielectric layer 1006, and the remaining unlabeled via holes are some examples of via holes that can be set in practical applications for electrical connection between structures.

Figure 12E:
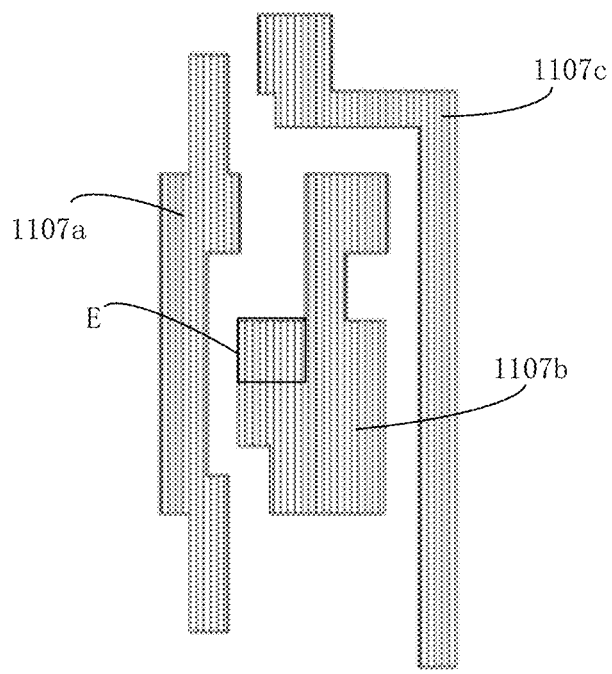
Figure 12F:
Figure 14E:
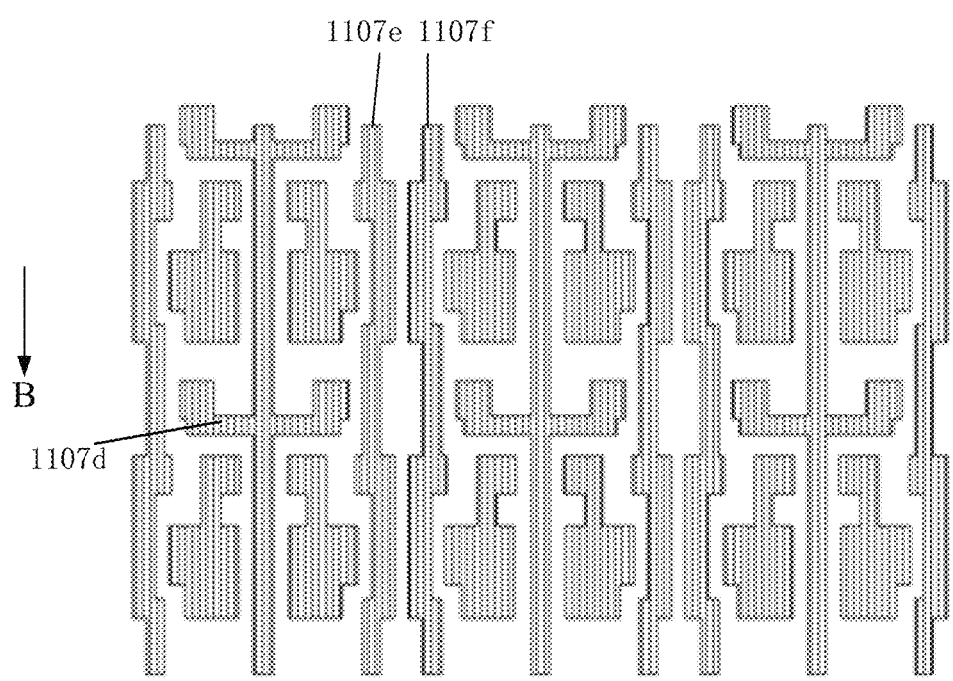

Optionally, in conjunction with FIG. 12e and FIG. 14e, FIG. 12e shows a plurality of third metal layer structures 1107 of the third metal layer 1007 of one sub-pixel unit 100, that is, a first metal structure 1107a of the third metal layer 1007, a second metal structure 1107b of the third metal layer 1007 and a third metal structure 1107c of the third metal layer 1007. A part E in the second metal structure 1107b of the third metal layer 1007 is originally a via hole for electrically connecting the fourth metal layer structure 1109 to the second metal layer structure 1105. In an embodiment of the present disclosure, since the via hole in the second interlayer dielectric layer structure 1108 that electrically connects the fourth metal layer structure 1109 to the second metal layer structure 1105 of the sub-pixel unit 100 in the display area (AA area) is cancelled, the fourth metal layer structure 1109 and the second metal layer structure 1105 are electrically connected in pixels in the surrounding blank area (dummy area), so that an area of the second metal structure 1107b of the third metal layer 1007 of the i-th row of sub-pixel unit 100, and an area of the fourth metal layer structure 1107d of the third metal layer 1007 of the (i+1)-th row of sub-pixel unit 100 can be increased. Both the second metal layer structure 1107b of the third metal layer 1007, and the fourth metal layer structure 1107d of the third metal layer 1007 belong or correspond to the third metal layer structure 1107 of each sub-pixel unit 100. In other words, the area of the third metal layer structure 1107 is increased, which increases the area of the overlapping part between the third metal layer structure 1107 and the fourth metal layer structure 1109, thereby increasing the capacitance of the third capacitor C3 and the capacitance of the sub-pixel unit 100.

Optionally, in the structure of three parallel capacitors in the embodiment of the present disclosure, the fourth metal layer structure 1109 and the second metal layer structure 1105 are electrically coupled to each other, and are used to transmit VDD signal of the VDD signal line. The second metal layer structures 1105 in each row of pixel units 100 are electrically coupled together in the horizontal direction, and the VDD signal lines of the fourth metal layer structure 1109 are electrically coupled together in each column, so that the VDD signal lines can be connected to the driving circuit in the dummy area outside the AA area, and used to transmit signals. In such manner, a position of a via hole is not required to be reserved in the third metal layer structure 1107, which is used for electrically connecting the fourth metal layer structure 1109 and the second metal layer structure 1105, thus, the area of the third metal layer structure 1107 is increased or improved, thereby increasing the capacitance of the third capacitor C3 and the capacitance of the sub-pixel unit 100.

Figure 14F:
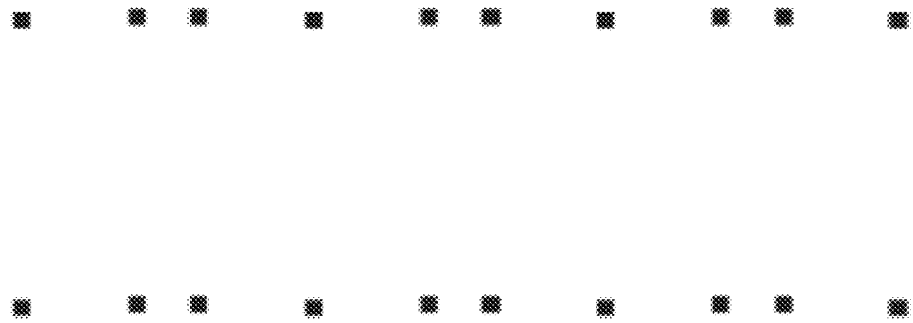

Optionally, in combination with FIG. 12f and FIG. 14f, FIG. 12f shows a second interlayer dielectric layer structure 1108 of a second interlayer dielectric layer 1008 of a sub-pixel unit 100, and the second interlayer dielectric layer is a film layer with a relatively high transparency. The third via hole 103 of the second interlayer dielectric layer is provided in a non-display area, and the unlabeled via holes are some examples of via holes that can be set in practical applications for electrical connection between structures.

Figure 12G:
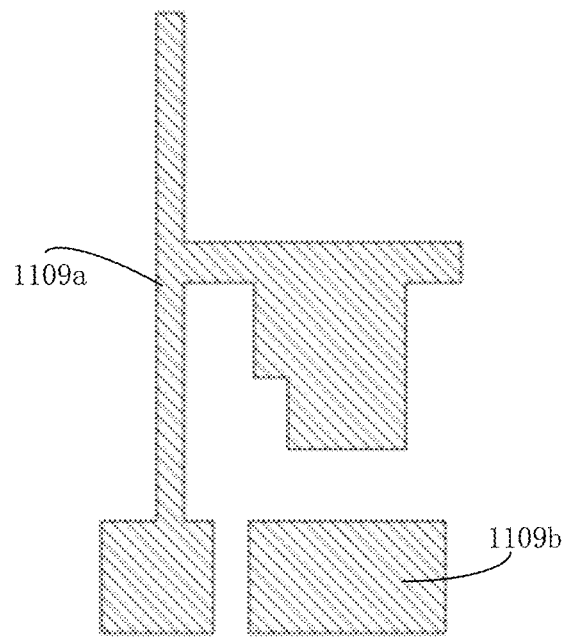
Figure 14G:
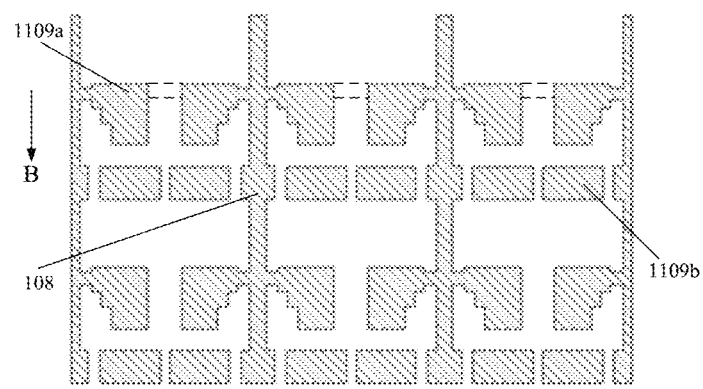

Optionally, with reference to FIG. 12g and FIG. 14g, FIG. 12g shows multiple fourth metal layers 1009 of the fourth metal layer 1009 of one sub-pixel unit 100, and each fourth metal layer 1009 includes a first metal structure 1109a of the fourth metal layer 1009 and a second metal layer structure 1109b of the fourth metal layer 1009.

FIG. 13a to FIG. 13d are schematic structural diagrams of film layers in the preparation process corresponding to structural diagrams of film layers of FIG. 12a to FIG. 12g, which are further explained in the following preparation method.

Optionally, referring to FIG. 14a, the first active layer 1001a of a plurality of sub-pixel units 100 are shown. The first active layer 1001a of the plurality of sub-pixel units 100 is a mirror symmetric structure. In the first direction A, a first connection portion 107 is arranged between a first active layer 1001a of the n-th sub-pixel unit 100 and a first active layer 1001a of the (n+1)-th sub-pixel unit 100, where n≥1, and n is an even number. The first connection portion 107 is arranged in such a manner that channel source electrodes of switching components TFT arranged in a mirror symmetric manner in the first direction A are shared in the first connection portion 107, which may be electrically connected to the power supply line VDD in the fourth metal layer structure 1109 in the second direction B through a via hole herein, thereby reducing the area of the via hole and saving the layout space.

Optionally, referring to FIG. 14b, a film structure of the first metal layer 1003 of a plurality of sub-pixel units 100 is shown.

Optionally, referring to FIG. 14c, a film structure of the second metal layer 1005 of a plurality of sub-pixel units 100 is shown.

Optionally, referring to FIG. 14d, a film structure of the first interlayer dielectric layer 1006 of a plurality of sub-pixel units 100 is shown.

Optionally, referring to FIG. 14e, a film structure of the third metal layer 1007 of a plurality of sub-pixel units 100 is shown. The film structure of the third metal layer 1007 of the multiple sub-pixel units 100 is a mirror symmetric structure. The third metal layer 1007 includes a fourth metal structure 1107d of the third metal layer 1007, a fifth metal structure 1107e of the third metal layer 1007, and a sixth metal structure 1107f of the third metal layer 1007. In the first direction A, the fifth metal structure 1107e of the third metal layer 1007 and the sixth metal structure 1107f of the third metal layer 1007 are adjacent fifth metal layer structures 1111 of the m-th sub-pixel unit 100 and the (m+1)-th sub-pixel unit 100, where m≥2, and m is an even number. The fifth metal structure 1107e of the third metal layer 1007 and the sixth metal structure 1107f of the third metal layer 1007 are used as two data signal lines, and the two data signal lines are adjacent to each other, and there is no other signal line arranged along the second direction B between them.

Optionally, the fourth metal structure 1107d of the third metal layer 1007 is arranged along the second direction B, which is used as a reset signal line Vinit. The fourth metal structure 1107d of the third metal layer 1007 includes a connection portion arranged along the first direction A, and the connection portion is connected to the first active layer 1001a. The mirror symmetry structure allows the circuit to share one reset signal line Vinit along the second direction B, thereby reducing the number of via holes, saving the area, and saving the layout space.

Optionally, referring to FIG. 14f, a film structure of the second interlayer dielectric layer 1008 of a plurality of sub-pixel units 100 is shown.

Optionally, referring to FIG. 14g, a film structure of the fourth metal layer 1009 of a plurality of sub-pixel units 100 is shown. The film structure of the fourth metal layer 1009 of the multiple sub-pixel units 100 is a mirror symmetric structure. The metal layer 1009 includes a second connection portion 108 corresponding to the first connection portion 107. The second connection portion 108 is arranged in such a manner that channel source electrode of switching components TFT arranged in a mirror symmetric manner in the first direction A are shared in the second connection portion 108, which may be connected to a signal line of the power supply line VDD in the second direction B in the fourth metal layer structure 1109 through a via hole, thereby reducing the number of via holes, saving the area, and saving the layout space.

Optionally, referring to FIG. 12g and FIG. 14g, the second metal structure 1109b of the fourth metal layer 1009 is connected to the anode of the light-emitting element 120 through an overlap joint, and a structure, a position and a shape of the second metal structure 1109b of the fourth metal layer 1009 can be adjusted according to actual applications.

Optionally, referring to FIG. 12g and FIG. 14g, first metal structures 1109a of the fourth metal layer 1009 of multiple sub-pixel unit 100 may be electrically coupled or connected in the first direction A (the dashed line means that it can be coupled or connected), so that the power supply lines VDD in the second direction B are connected in parallel in the first direction A, thereby reducing the resistance of the power supply line VDD.

Figure 8:
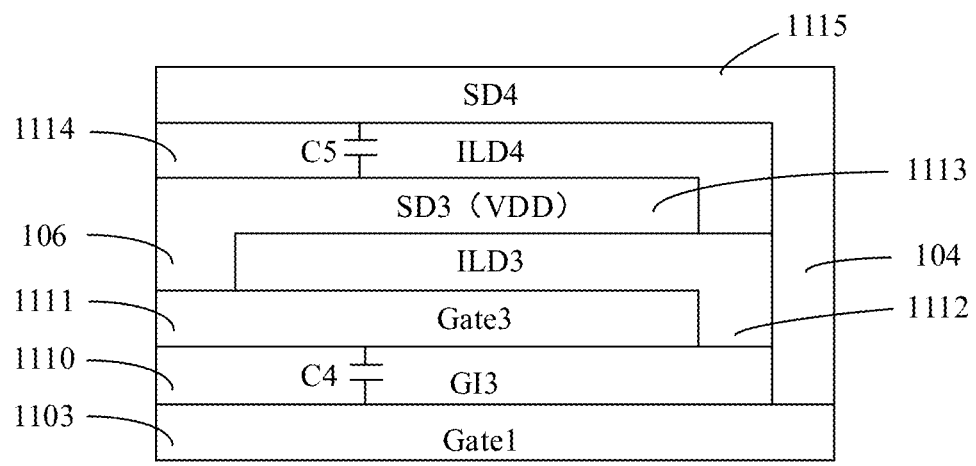
FIG. 8 is a schematic diagram of a film structure of a pixel circuit structure of an array substrate provided by another embodiment of the present disclosure, which illustrates a structure with two capacitors being in parallel.

In some embodiments, referring to FIG. 8, the sub-pixel unit 100 further includes a third insulating structure 1110, a fifth metal layer structure 1111, a third interlayer dielectric layer structure 1112, a sixth metal layer structure 1113, a fourth interlayer dielectric layer structure 1114 and a seventh metal layer structure 1115, which are stacked one by one.

Optionally, referring to FIG. 1, FIG. 5 and FIG. 8, the first metal layer structure 1103 of the driving transistor 111 of a sub-pixel unit 100 is electrically coupled to a first end of the seventh metal layer structure 1115 of the (i+1)-th row of sub-pixel unit 100, and a second end of the seventh metal layer structure 1115 is electrically coupled to the active structure 1101 of the second reset transistor 113.

Figure 15A:
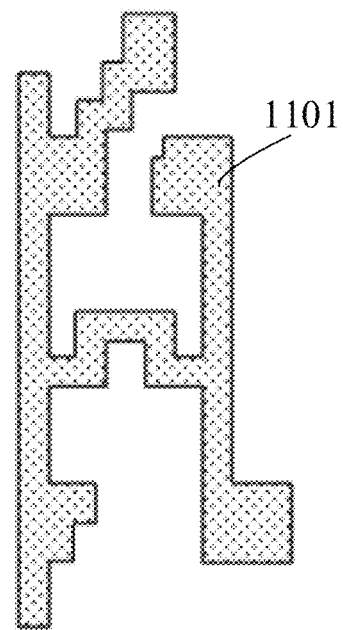
FIGS. 15a to 15g are schematic diagrams sequentially showing a second active layer, a first metal layer, a fifth metal layer, a third interlayer dielectric layer, and a sixth metal layer, a fourth interlayer dielectric layer, and a seventh metal layer of one sub-pixel unit of an array substrate provided by another embodiment of the present disclosure, after the manufacture of each film has been completed, which show a structure of two capacitors forming a parallel structure.
Figure 15B:
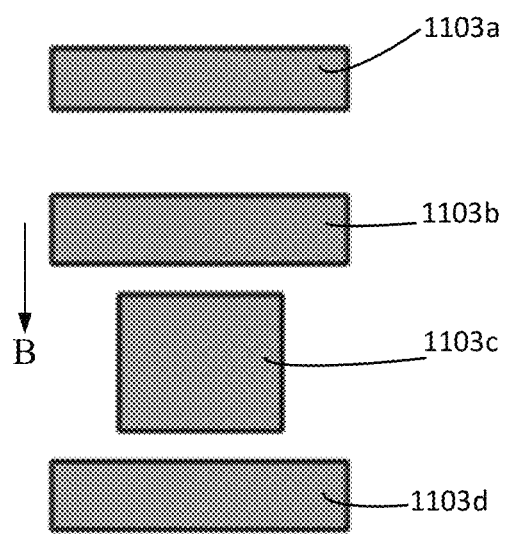
Figure 15C:
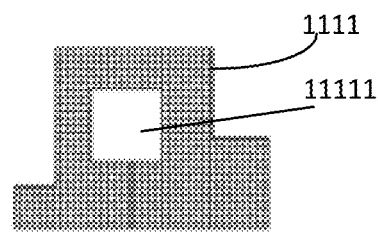
Figure 15D:
Figure 15D:
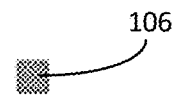
Figure 15E:
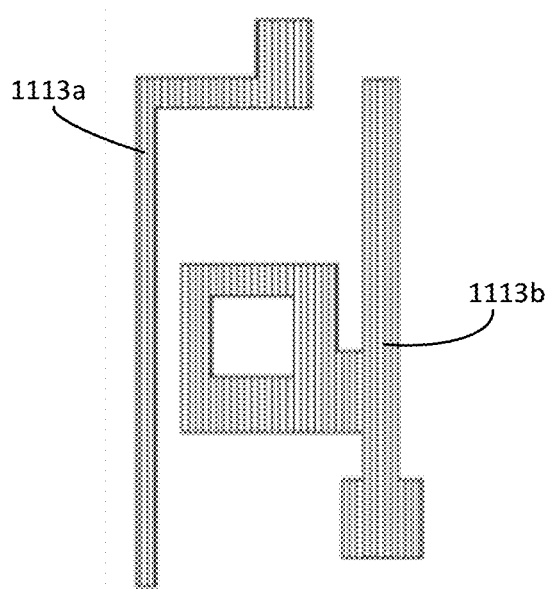
Figure 15F:
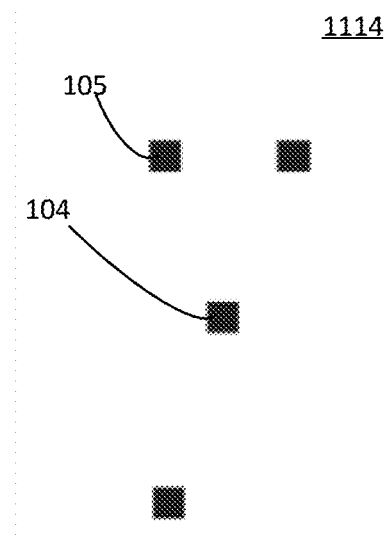
Figure 16A:
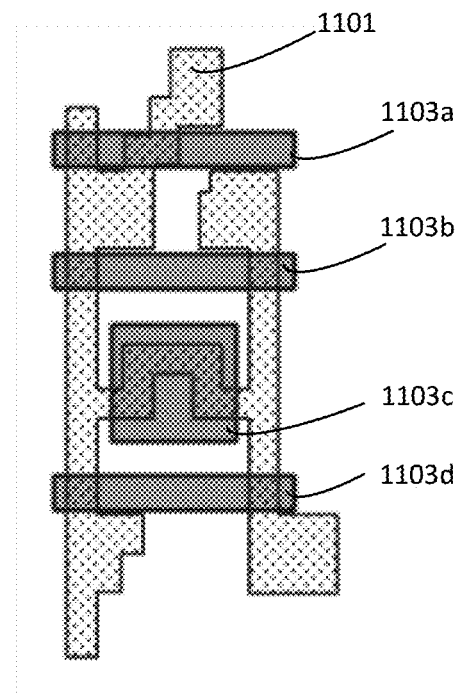
FIG. 16a is a schematic diagram of a film structure of the active layer and the first metal layer of FIGS. 15a and 15b after manufacture has been completed.
Figure 16B:
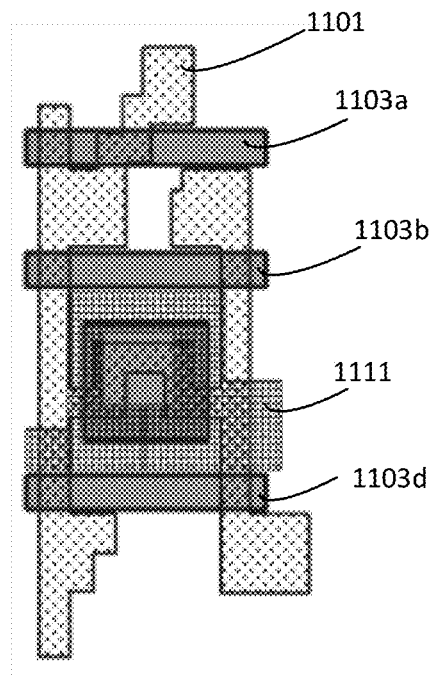
Figure 16C:
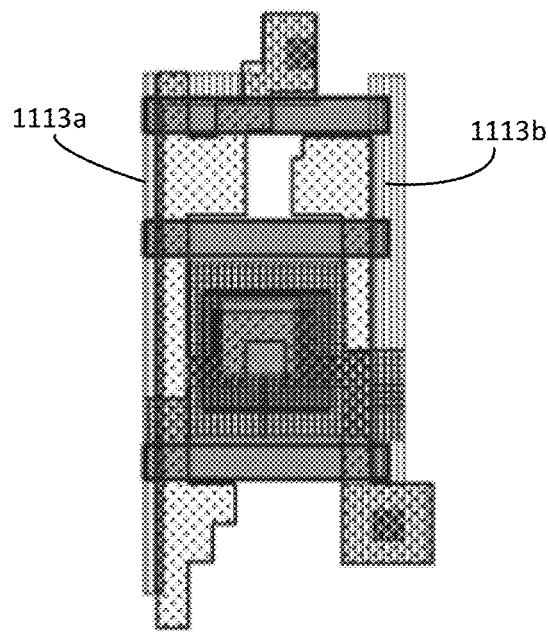
FIG. 16c is a schematic diagram of a film structure after the third interlayer dielectric layer of FIG. 15d and the sixth metal layer of FIG. 15e are manufactured on the basis of the film structure of FIG. 16b.
Figure 16D:
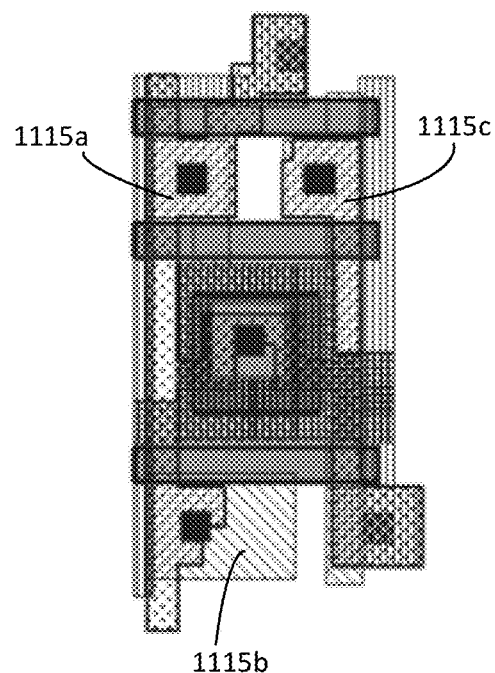
FIG. 16d is a schematic diagram of a film structure after the fourth interlayer dielectric layer of FIG. 15f and the seventh metal layer of FIG. 15g are manufactured on the basis of the film structure of FIG. 16c.

In some embodiments, referring to FIG. 8, FIG. 15f and FIG. 16d, an orthographic projection of the first end of the seventh metal layer structure 1115 onto the base substrate 1120 of the sub-pixel unit 100 at least partially overlaps with an orthographic projection of the metal layer structure 1103 of the driving transistor 111 onto the base substrate 1120, and at the overlapped area, a fourth via hole 104 is provided in the third insulating structure, the third interlayer dielectric layer structure 1112, and the fourth interlayer dielectric layer structure 1114. The first end of the seventh metal layer structure 1115 is electrically coupled to the first metal layer structure 1103 of the driving transistor 111 through the fourth via hole 104.

Optionally, referring to FIG. 15b, FIG. 15f, FIG. 15g, FIG. 16d and FIG. 4, the seventh metal layer 1015 includes a plurality of seventh metal layer structures 1115, and the plurality of seventh metal layer structures 1115 includes a first metal structure 1115a of the seventh metal layer 1015, a second metal structure 1115b of the seventh metal layer 1015, and a third metal structure 1115c of the seventh metal layer 1015. The first end of the first metal structure 1115a of the seventh metal layer 1015 is electrically coupled to the first metal layer structure 1103 of the driving transistor 111 through the fourth via hole 104.

Figure 15G:
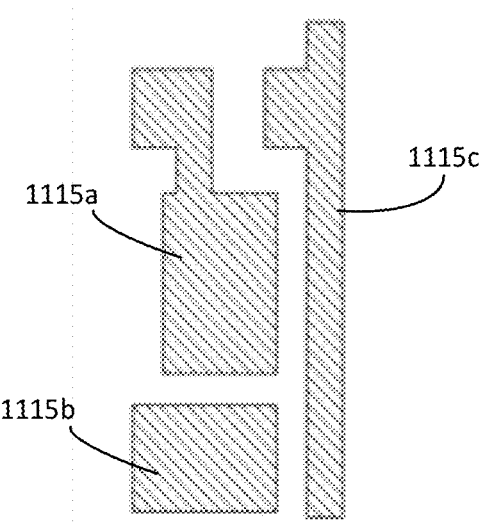

In some embodiments, referring to FIG. 15f and FIG. 15g, an orthographic projection of a second end of the seventh metal layer structure 1115 onto the base substrate 1120 at least partially overlaps with an orthographic projection of the active structure 1101 of the second reset transistor 113 onto the base substrate 1120, and at the overlapped area, a fifth via hole 105 is provided in the third insulating structure 1110, the third interlayer dielectric structure 1112 and the fourth interlayer dielectric structure 1114. The second end of the seventh metal layer structure 1115 is electrically coupled to the active structure 1101 of the second reset transistor 113 through the fifth via hole 105.

Optionally, referring to FIG. 15b, FIG. 15f, FIG. 15g, FIG. 16d and FIG. 4, the first end of the first metal structure 1115a of the seventh metal layer 1015 is electrically coupled to the active structure 1101 of the second reset transistor 113 through the fifth via hole 105.

In some embodiments, referring to FIG. 8, the third interlayer dielectric layer structure 1112 is provided with a sixth via hole 106. The sixth metal layer structure 1113 is electrically coupled to the fifth metal layer structure 1111 through the sixth via hole 106.

Optionally, referring to FIG. 15c, FIG. 15f, FIG. 15g, FIG. 16d and FIG. 4, the sixth metal layer 1013 includes two sixth metal layer structures 1113, and the two sixth metal layer structures 1113 include a first metal structure 1113a of the sixth metal layer 1013 and a second metal structure 1113b of the sixth metal layer 1013.

In some embodiments, an orthographic projection of the fifth metal layer structure 1111 onto the base substrate 1120 at least partially overlaps with an orthographic projection of the first metal layer structure 1103 onto the base substrate 1120, and a fourth capacitor C4 is formed between the fifth metal layer structure 1111 and the first metal layer structure 1103 at the overlapped area.

An orthographic projection of the seventh metal layer structure 1115 onto the base substrate 1120 at least partially overlaps with an orthographic projection of the sixth metal layer structure 1113 onto the base substrate 1120, and a fifth capacitor C5 is formed between the seventh metal layer structure 1115 and the sixth metal layer structure 1113 at the overlapped area.

In some embodiments, the seventh metal layer structure 1115 serves as a reset signal line to receive a reset signal. The seventh metal layer structure 1115 may also be coupled to a data signal line to receive the Vdata signal, and a gate electrode of the driving transistor 111 (i.e., the switching component T2) is coupled to the reset signal line Vinit, to receive the reset signal Vinit.

Optionally, the sixth metal layer structure 1113 serves as a power supply line to receive a power voltage. The sixth metal layer structure 1113 may be electrically coupled to the power supply line VDD, and may also be electrically coupled to the reset signal line Vinit.

As another example, referring to FIG. 8, in an embodiment, the first metal layer structure 1103 is Gate1, the third insulating structure 1110 is G13, the fifth metal layer structure 1111 is Gate3, the third interlayer dielectric layer structure 1112 is ILD3, the sixth metal layer structure 1113 is SD3 (which may include a VDD structure, and serve as a power supply line to provide a power voltage), the fourth interlayer dielectric layer structure 1114 is ILD4, and the seventh metal layer structure 1115 is SD4. A part of the seventh metal layer structure 1115 is filled in the fourth via hole 104, and a part of the sixth metal layer structure 1113 is filled in the sixth via hole 106.

The third insulating structure 1110, the third interlayer dielectric layer structure 1112, and the fourth interlayer dielectric layer structure 1114 are insulating layers. The fourth capacitor C4 and the fifth capacitor C5 form a parallel structure, so as to obtain a larger storage capacitor in a limited layout space, thereby improving the voltage stabilization capability.

As another example, referring to FIG. 10, the structure with two capacitors shown in FIG. 8 is adopted, a poly layer (polysilicon layer) is provided on a side of the base substrate 1120, the active structure 1101 is a Poly layer, and the first insulating structure 1102 is GI1. The source and drain electrodes of the driving transistor 111 are formed by the Poly layer, Gate1 is a gate electrode, Gate3 is an electrode plate of a capacitor, and may be used as some signal lines at the same time. SD3 is a power supply line, which is electrically coupled to Gate3 through ILD3. SD4 is the other electrode plate of the capacitor, and is electrically coupled to Gate1, and SD4 may be used as some signal lines to form a structure in which two capacitors of the fourth capacitor C4 and the fifth capacitor C5 are connected in parallel.

In an embodiment, a connection structure of a switching component is also provided. The source and drain electrodes may be a metal layer structure. A PLN layer is prepared on a side of SD4 away from ILD4. A via hole is opened or arranged in the PLN layer. An anode (Anode) layer is arranged on a side of the PLN layer away from SD4, and the anode layer is electrically coupled to SD4 through the via hole. The PDL layer is arranged on a side of the anode layer away from the PLN layer, an opening is opened or arranged in the PDL layer, and a light-emitting layer is prepared on a side of the PDL layer away from the anode layer.

In some embodiments, both the first metal layer structure 1103 of the first reset transistor 112 of the i-th row of sub-pixel unit 100, and the first metal layer structure 1103 of the second reset transistor 113 of the (i+1)-th row of sub-pixel unit 100 belong to the same first metal layer structure 1103 of the (i+1)-th row of sub-pixel unit 100.

As an example, FIGS. 15a to 15g are schematic structural diagrams showing a second active layer 1001b, a first metal layer 1003, a fifth metal layer 1011, a third interlayer dielectric layer 1012, a sixth metal layer 1013, a fourth interlayer dielectric layer 1014, and a seventh metal layer 1015 of one sub-pixel unit 100 of an array substrate after preparation is completed provided by an embodiment of the present disclosure. The sub-pixel unit 100 according to the embodiment of the present disclosure forms a structure in which two capacitors of the fourth capacitor C4 and the fifth capacitor C5 are connected in parallel. The third insulating layer 1010 corresponding to the third insulating structure 1110 is a film with a relatively high transparency.

Figure 17A:
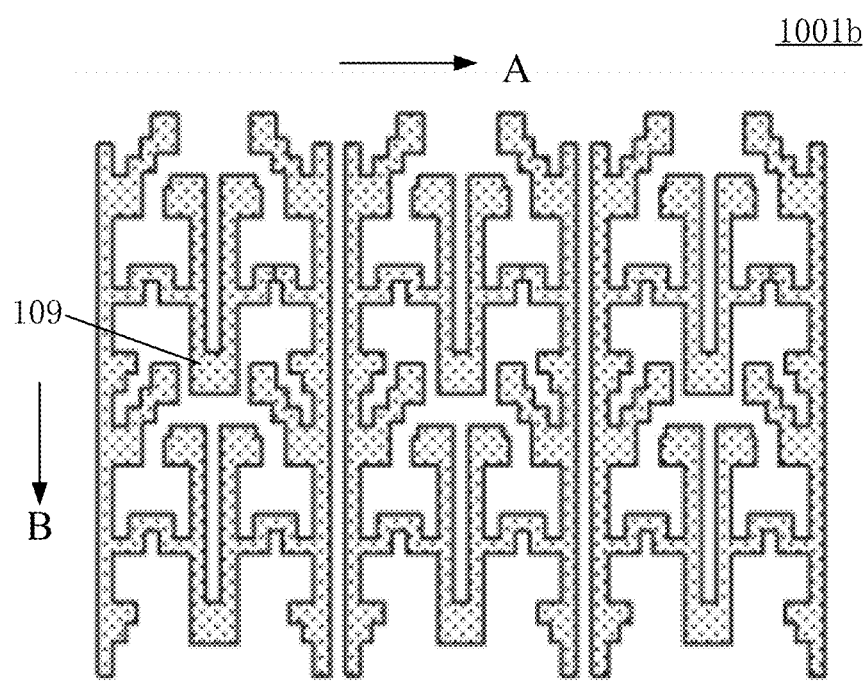
FIGS. 17a to 17g are schematic diagrams sequentially showing a second active layer, a first metal layer, a fifth metal layer, a third interlayer dielectric layer, a sixth metal, a fourth interlayer dielectric layer, and a seventh metal layer of a plurality of sub-pixel units of an array substrate provided by another embodiment of the present disclosure, after the manufacture of each film has been completed, which show a structure of two capacitors forming a parallel structure.

Optionally, in conjunction with FIG. 15a and FIG. 17a, FIG. 15a shows an active structure 1101 of the second active layer 1001b of one sub-pixel unit 100.

Figure 17B:
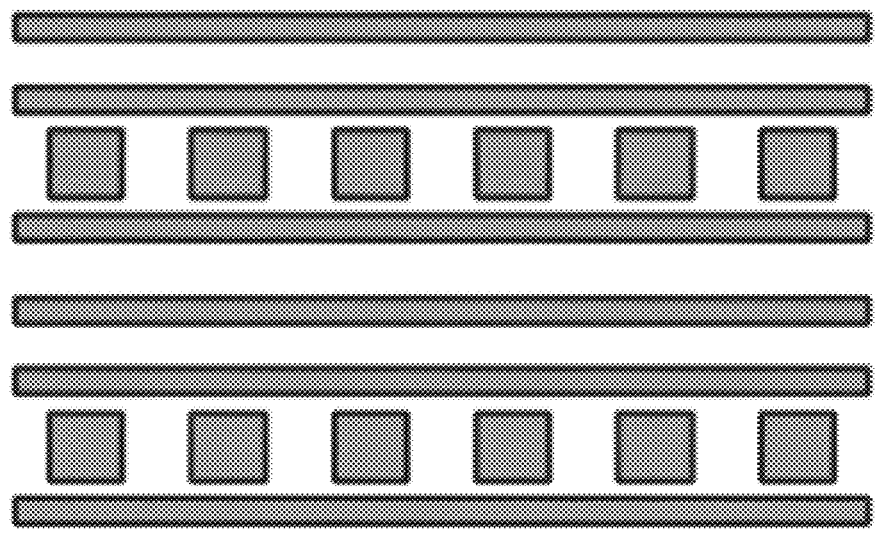

Optionally, in conjunction with FIG. 15b and FIG. 17b, FIG. 15b shows a plurality of first metal layer structures 1103 of the first metal layer 1003 of one sub-pixel unit 100 arranged along the second direction B. The plurality of first metal layer structures 1103 includes a first metal structure 1103a of the first metal layer 1003, a second metal structure 1103b of the first metal layer 1003, a third metal structure 1103c of the first metal layer 1003, and a fourth metal structure 1103d of the first metal layer 1003.

Figure 17C:
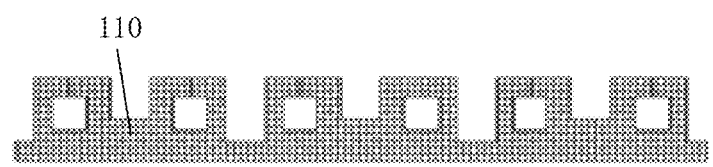
Figure 17C:
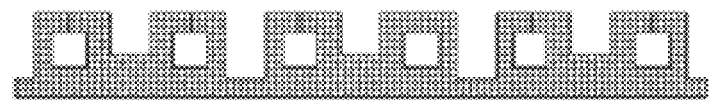

Optionally, in conjunction with FIG. 15c and FIG. 17c, FIG. 15c shows a fifth metal layer structure 1111 of the fifth metal layer 1011 of one sub-pixel unit 100, and the fifth metal layer structure 1111 is provided with a second opening 11111, which is separated and insulated from the fourth via hole 104.

Figure 17D:
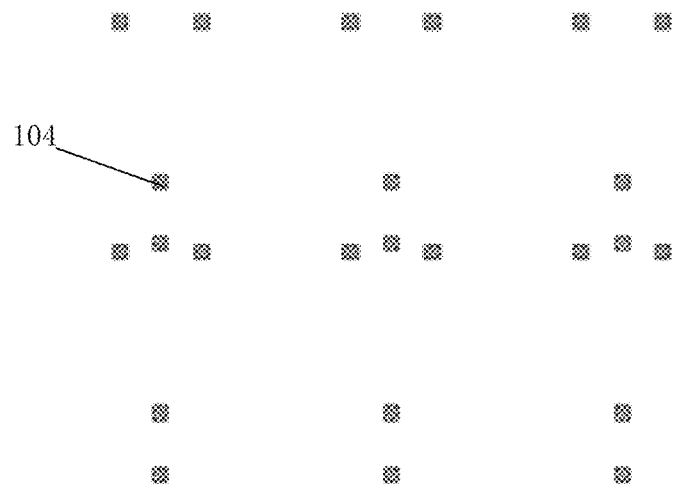

Optionally, in conjunction with FIG. 15d and FIG. 17d, FIG. 15d shows a third interlayer dielectric layer structure 1112 of a third interlayer dielectric layer 1012 of a sub-pixel unit 100, and the third interlayer dielectric layer structure 1112 is a structure with a relatively high transparency. The third interlayer dielectric layer structure 1112 is provided with a sixth via hole 106, and the remaining unlabeled via holes are some examples of via holes that can be set in practical applications for electrical connection between structures.

Figure 17E:
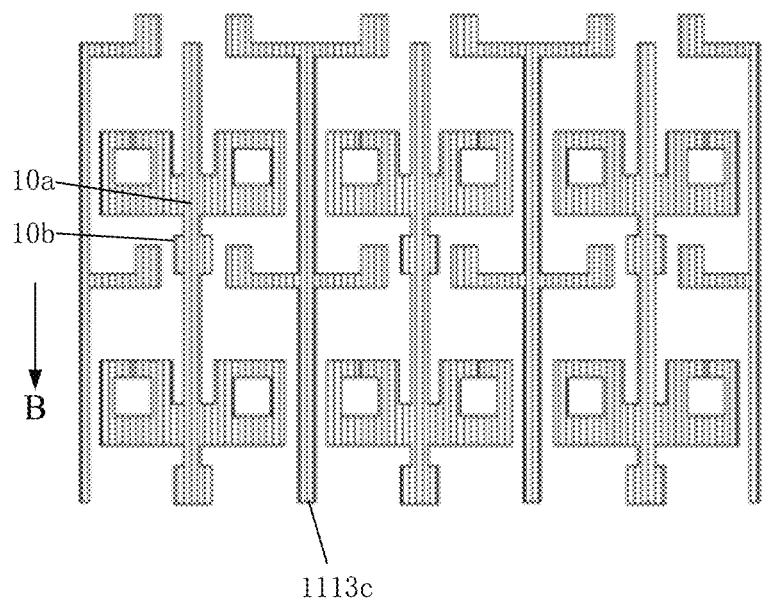

Optionally, with reference to FIG. 15e and FIG. 17e, FIG. 15e shows two sixth metal layer structures 1113 of the sixth metal layer 1013 of one sub-pixel unit 100, and the two sixth metal layer structures 1113 include a first metal structure 1113a of the sixth metal layer 1013 and a second metal structure 1113b of the sixth metal layer 1013.

Figure 17F:
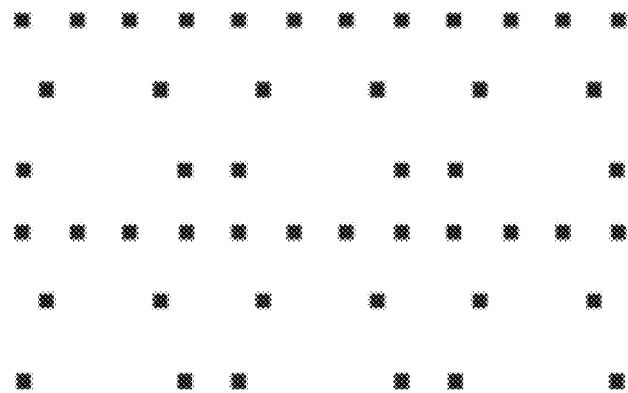

Optionally, in conjunction with FIG. 15f and FIG. 17f, FIG. 15f shows a fourth interlayer dielectric layer structure 1114 of the fourth interlayer dielectric layer 1014 of one sub-pixel unit 100, and the fourth interlayer dielectric layer structure 1114 is a structure with a relatively high transparency. The fourth interlayer dielectric layer structure 1114 is provided with a fourth via hole 104 and a fifth via hole 105.

Figure 17G:
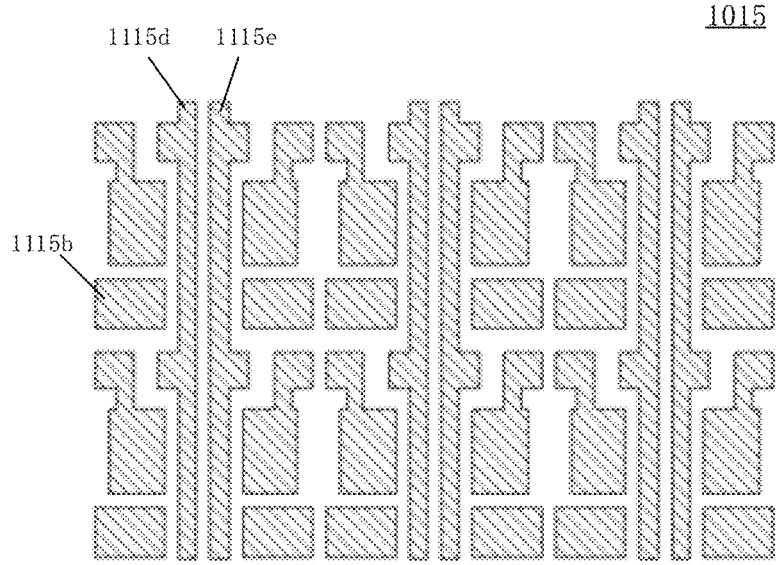

Optionally, with reference to FIG. 15g and FIG. 17g, FIG. 15g shows three seventh metal layer structures 1115 of the seventh metal layer 1015 of one sub-pixel unit 100, and the three seventh metal layer structures 1115 include a first metal structure 1115a of the seventh metal layer 1015, a second metal structure 1115b of the seventh metal layer 1015, and a third metal structure 1115c of the seventh metal layer 1015.

FIG. 16a to FIG. 16d are schematic structural diagrams of film layers in the preparation process corresponding to structural diagrams of film layers of FIG. 15a to FIG. 15g, which are further explained in the following preparation method.

Optionally, referring to FIG. 17a, the second active layer 1001b of a plurality of sub-pixel units 100 is shown. The second active layer 1001b of the plurality of sub-pixel units 100 has a mirror symmetric structure. In the first direction A, the second active layer 1001b between the n-th sub-pixel unit 100 and the (n+1)-th sub-pixel unit 100 has a third connection portion 109, where n≥1, and n is an odd number. The third connection portion 109 is arranged in such a manner that channel source electrodes of switching components TFT arranged in a mirror symmetric manner in the first direction A are shared in the third connection portion 109, which may be electrically connected to a signal line of the power supply line VDD in the sixth metal layer structure 1113 in the second direction B through a via hole herein, thereby reducing the area of the via hole and saving the layout space.

Optionally, referring to FIG. 17b, a film structure of the first metal layer 1003 of a plurality of sub-pixel units 100 is shown.

Optionally, referring to FIG. 17c, a film structure of the fifth metal layer 1011 of a plurality of sub-pixel units 100 is shown. The fifth metal layer 1011 is of a mirror-symmetric structure. The fifth metal layer structures 1111 of the fifth metal layer 1011 of multiple sub-pixel units 100 in a same row are electrically connected through the fourth connection portion 110. At the fourth connection portion 110, the fifth metal layer structure 1111 is joint connected to a power supply line VDD of the sixth metal layer structure 1113 through a via hole, and since the sixth metal layer 1013 and the fifth metal layer 1011 are mirror-symmetrical structures, which are connected through a fourth via hole 104 arranged at the fourth connection portion 110, thereby reducing the number of via holes, saving the area, and saving the layout space.

Optionally, referring to FIG. 17d, a film structure of the third interlayer dielectric layer 1012 of a plurality of sub-pixel units 100 is shown, and the third interlayer dielectric layer 1012 of each sub-pixel unit 100 is correspondingly provided with a fourth via hole 104.

Optionally, referring to FIG. 17e, a film structure of the sixth metal layer 1013 of the multiple sub-pixel units 100 is shown. The film structure of the sixth metal layer 1013 of the multiple sub-pixel units 100 is a mirror symmetry structure. The sixth metal layer 1013 includes a fifth connection portion 10a and a sixth connection portion 10b. The fifth connection portion 10a and the fifth metal layer structure 1111 are joint connected through a via hole. The sixth metal layer 1013 and the fifth metal layer 1011 are mirror symmetric structures, which may be connected at the fifth connection portion 10a, thereby reducing the number of via holes, saving the area, and further saving the layout space.

Optionally, the sixth connection portion 10b is arranged in such a manner that channel source electrodes of switching components TFT arranged in a mirror symmetric manner in the first direction A are shared in the sixth connection portion 10b, which may be connected to a signal line of the power supply line VDD of the fifth metal layer structure 1111 in the second direction B, thereby reducing the number of via holes, saving the area, and further saving the layout space.

Optionally, the sixth metal layer 1013 includes a second metal structure 1113c of the sixth metal layer 1013, and the second metal structure 1113c of the sixth metal layer 1013 is used as a reset signal line Vinit extending along the second direction B. The second metal structure 1113c of the sixth metal layer 1013 includes a connection portion extending along the first direction A. The connection portion is connected to the second active layer 1001b, for example, the connection portion is electrically connected to an active structure 1101 of the active switching component T6. This mirror symmetry structure allows the circuit to share a reset signal line Vinit along the second direction B, reducing the number of wires, saving the area and saving the layout space.

Optionally, referring to FIG. 17f, a film structure of the fourth interlayer dielectric layer 1014 of a plurality of sub-pixel units 100 is shown.

Optionally, referring to FIG. 17g, a seventh metal layer 1015 of a plurality of sub-pixel units 100 is shown, a second metal structure 1115b of the seventh metal layer 1015 is joint connected to the anode of the light-emitting element, and a structure, a position and a shape of the second metal structure 1115b of the seventh metal layer 1015 can be adjusted according to the actual applications.

The seventh metal layer 1015 includes a fourth metal structure 1115d of the seventh metal layer 1015 and a fifth metal structure 1115e of the seventh metal layer 1015. In the first direction A, the fourth metal structure 1115d of the seventh metal layer 1015 and the fifth metal structure 1115e of the seventh metal layer 1015 are respectively adjacent fifth metal layer structures 1111 between the k-th sub-pixel unit 100 and the (k+1)-th sub-pixel unit 100, where k≥1, and k is an odd number. The fourth metal structure 1115d of the seventh metal layer 1015 and the fifth metal structure 1115e of the seventh metal layer 1015 are used as two data signal lines, and the two data signal lines are adjacent to each other, and there is no other signal line arranged along the second direction B between them.

Based on the same inventive concepts, embodiments of the present disclosure provide a display panel, including: the array substrate according to any embodiment of the present disclosure.

Based on the same inventive concepts, embodiments of the present disclosure provide a display device, including: the array substrate according to any embodiment of the present disclosure or the display panel according to any embodiment of the present disclosure.

Figure 11:
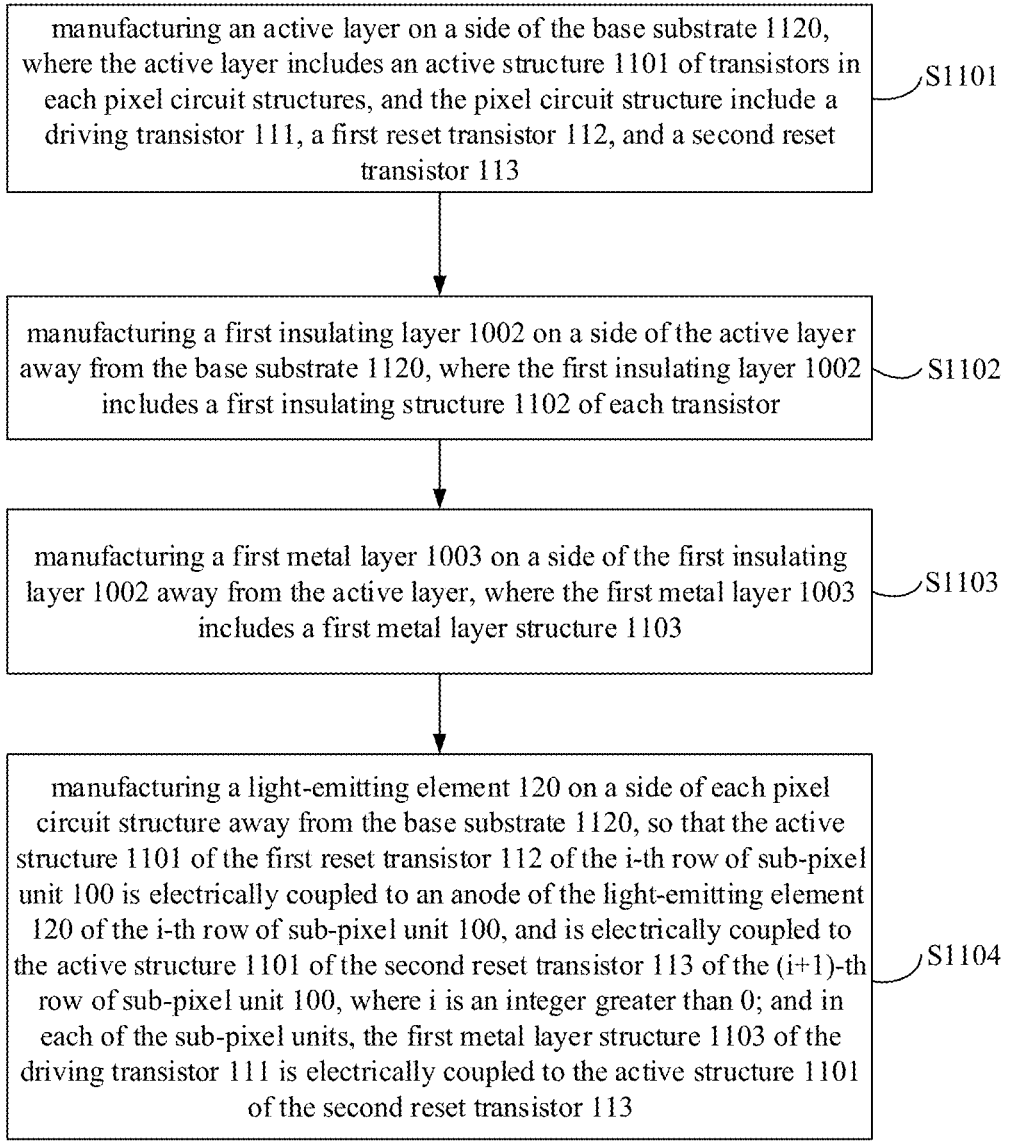
FIG. 11 is a flowchart of a method for manufacturing an array substrate provided by an embodiment of the present disclosure.

Based on the same inventive concepts, embodiments of the present disclosure provide a method for manufacturing an array substrate, which is applied to the array substrate according to any embodiment of the present disclosure. As shown in FIG. 11, the method for manufacturing the array substrate includes steps S1101 to S1104.

Step S1101 includes: manufacturing an active layer on a side of the base substrate 1120, where the active layer includes an active structure 1101 of transistors in each pixel circuit structures, and the pixel circuit structure include a driving transistor 111, a first reset transistor 112, and a second reset transistor 113. Specifically, the active layer includes a first active layer 1001a and a second active layer 1001b.

Step S1102 includes: manufacturing a first insulating layer 1002 on a side of the active layer away from the base substrate 1120, where the first insulating layer 1002 includes a first insulating structure 1102 of each transistor.

Step S1103 includes: manufacturing a first metal layer 1003 on a side of the first insulating layer 1002 away from the active layer, where the first metal layer 1003 includes a first metal layer structure 1103.

Optionally, the first metal layer 1003 is a conductive layer, which may include a gate structure of a transistor, or may include a gate signal line.

Step S1104 includes: manufacturing a light-emitting element 120 on a side of each pixel circuit structure away from the base substrate 1120, so that the active structure 1101 of the first reset transistor 112 of the i-th row of sub-pixel unit 100 is electrically coupled to an anode of the light-emitting element 120 of the i-th row of sub-pixel unit 100, and is electrically coupled to the active structure 1101 of the second reset transistor 113 of the (i+1)-th row of sub-pixel unit 100, where i is an integer greater than 0; and in each of the sub-pixel units, the first metal layer structure 1103 of the driving transistor 111 is electrically coupled to the active structure 1101 of the second reset transistor 113.

Optionally, as shown in FIG. 7 and FIG. 9, after manufacturing a first metal layer 1003 on a side of the first insulating layer 1002 away from the active layer in step S1103, and before manufacturing a light-emitting element 120 on a side of each pixel circuit structure away from the base substrate 1120 in step S1104, the method includes: sequentially manufacturing a second insulating layer 1004, a second metal layer 1005, and a first interlayer dielectric layer 1006 on a side of the first metal layer 1003 away from the first insulating layer 1002, where the second insulating layer 1004 includes a second insulating structure 1104, the second metal layer 1005 includes a second metal layer structure 1105, and the first interlayer dielectric layer 1006 includes a first interlayer dielectric layer structure 1106.

The second insulating structure 1104 and the first interlayer dielectric layer structure 1106 are etched to form a first via hole 101, so that part of the first metal layer structure 1103 of the driving transistor 111 is exposed.

A third metal layer 1007 is manufactured on a side of the first interlayer dielectric layer 1006 away from the second metal layer 1005, so that a first end of the third metal layer 1007 is electrically coupled to the first metal layer structure 1103 of the driving transistor 111. The third metal layer 1007 includes a third metal layer structure 1107. That is, the third metal layer structure 1107 fills or occupies the first via hole 101, and the first end of the third metal layer structure 1107 is electrically coupled or connected to the first metal layer structure 1103 of the driving transistor 111.

A second interlayer dielectric layer 1008 is manufactured on a side of the third metal layer 1007 away from the first interlayer dielectric layer 1006, where the second interlayer dielectric layer 1008 includes a second interlayer dielectric layer structure 1108.

The first interlayer dielectric layer structure 1106 and the second interlayer dielectric layer structure 1108 are etched to form a third via hole 103 so that the second metal layer structure 1105 is partially exposed.

A fourth metal layer 1009 is manufactured on a side of the second interlayer dielectric layer 1008 away from the third metal layer 1007, so that a second end of the fourth metal layer 1009 is electrically coupled to the second metal layer structure 1105. The fourth metal layer 1009 includes a fourth metal layer structure 1109. The fourth metal layer structure 1109 fills the third via hole 103 and is electrically coupled to the second metal layer structure 1105.

As an example, referring to FIGS. 13a to 13d, in combination with a film structure shown in FIGS. 12a to 12g and FIG. 9, a method for manufacturing a pixel circuit structure of an array substrate is provided. An example of a process for manufacturing one sub-pixel unit 100 is given, which includes step 1 to step 9.

In step 1, an active structure 1101 of a first active layer 1001a is manufactured on one side of the base substrate 1120. Step 1 is to prepare a Poly layer. As shown in FIG. 12a, the Poly layer forms a channel of a switching component or serves as a wire or line.

In step 2, a first insulating structure 1102 of the first insulating layer 1002 is manufactured on a side of the active structure 1101 away from the base substrate 1120. Step 2 is to prepare a GI1 layer, the GI1 layer is a film with a relatively high transparency, the GI1 layer is a film coated by insulation materials, and no mask is used.

Figure 13A:
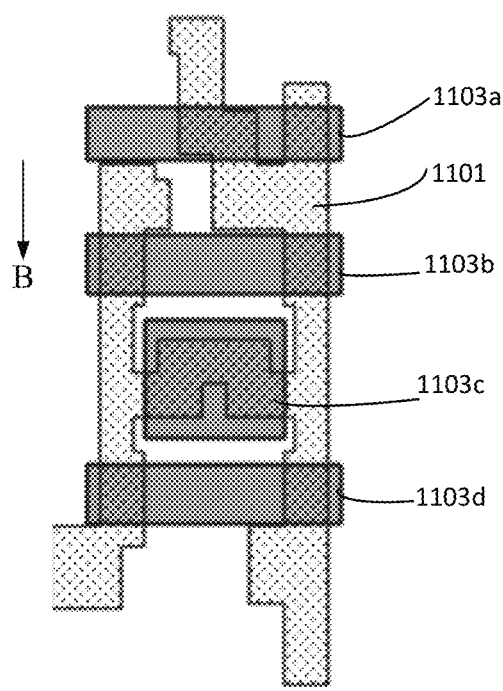
FIG. 13a is a schematic diagram of a film structure of the active layer of FIG. 12a and the first metal layer of FIG. 12b after the manufacture has been completed.

In step 3, a first metal layer 1003 is manufactured on a side of the first insulating layer 1002 away from the active structure 1101, and is etched to form a plurality of first metal layer structures 1103. Step 3 is to prepare a Gate1 layer. The structure of the Gate1 layer is shown in FIG. 12b, and a film structure after step 3 is completed is shown in FIG. 13a.

In step 4, a second insulating structure 1104 of a second insulating layer 1004 is manufactured on a side of the first metal layer structure 1103 away from the first insulating layer 1002. Step 4 is to prepare a GI2 layer, which is a film with a relatively high transparency and is a film coated by insulation materials without using a mask.

Figure 13B:
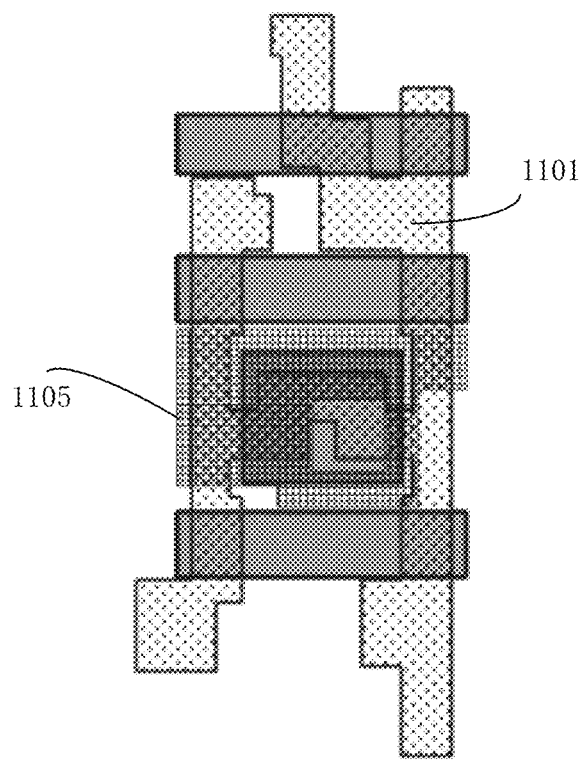

In step 5, a second metal layer structure 1105 is manufactured on a side of the second insulating layer 1004 away from the first metal layer structure 1103, and the second metal layer structure 1105 has a first opening 11051. Step 5 is to prepare a Gate2 layer. The structure of the Gate2 layer is shown in FIG. 12c. The second metal layer structure 1105 is used as an electrode layer of a capacitor, which may also be used as a wiring layer for other signals. A film structure after the manufacture in step 5 is shown in FIG. 13b.

In step 6, a first interlayer dielectric layer structure 1106 is manufactured on a side of the first metal layer structure 1103 away from the second insulating layer 1004, and the second insulating structure 1104 and the first interlayer dielectric layer structure 1106 are etched to form a first via hole 101. The first insulating structure 1102, the second insulating structure 1104, and the first interlayer dielectric layer structure 1106 are etched to form a second via hole 102, so that the active structure 1101 is partially exposed.

Specifically, the first via hole 101 is located inside a first opening 11051 of the second metal layer structure 1105, so that a conductive metal filled in the first via hole 101 does not contact the second metal layer structure 1105. Step 6 is a process of manufacturing the ILD1 layer and opening the first via hole 101 and the second via hole 102. The ILD1 layer is a film with a relatively high transparency, as shown in FIG. 12d.

Figure 13C:
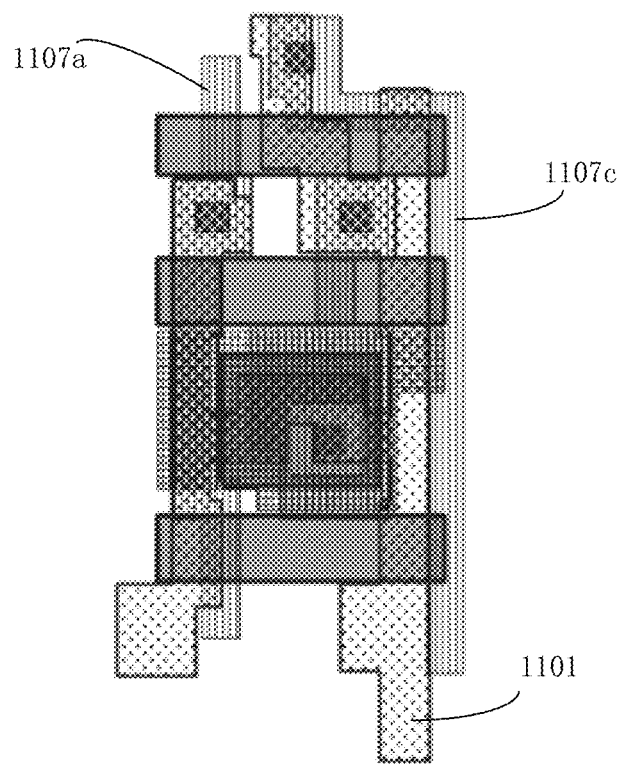
FIG. 13c is a schematic diagram of a film structure of the first interlayer dielectric layer of FIG. 12d and the third metal layer of FIG. 12e after they are manufactured on the basis of the film structure of FIG. 13b.

In step 7, a third metal layer structure 1107 is manufactured on a side of the first interlayer dielectric layer structure 1106 away from the second metal layer structure 1105, and the third metal layer structure 1107 fills the first via hole 101 and the second via hole 102. In such way, the third metal layer structure 1107 is electrically coupled or connected to the first metal layer structure 1103 of the driving transistor 111 through the first via hole 101, and the third metal layer structure 1107 is electrically coupled or connected to the active structure 1101 of the second reset transistor 113. Step 7 is a process of manufacturing the SD1 layer, as shown in FIG. 12e. A film structure after the manufacture in step 7 is shown in FIG. 13c.

In step 8, a second interlayer dielectric layer structure 1108 of a second interlayer dielectric layer 1008 is manufactured on a side of the third metal layer structure 1107 away from the first interlayer dielectric layer structure 1106 of the first interlayer dielectric layer 1006, and the first interlayer dielectric layer structure 1106 and the second interlayer dielectric layer structure 1108 are etched to form a third via hole 103, so that the second metal layer structure 1105 is partially exposed. Step 8 is a process of manufacturing the ILD2 layer and opening the third via hole 103. The ILD2 layer is a film with a relatively high transparency. In an embodiment, the third via hole 103 is located in a peripheral blank area (dummy area).

Figure 13D:
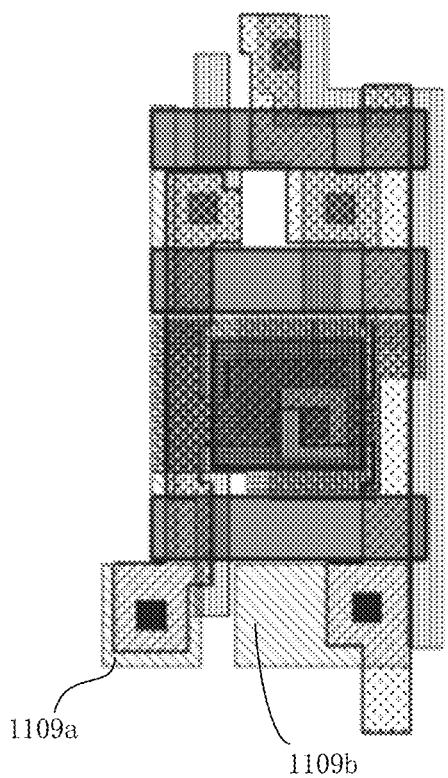
FIG. 13d is a schematic diagram of the film structure after the second interlayer dielectric layer of FIG. 12f and the fourth metal layer of FIG. 12g are manufactured on the basis of the film structure of FIG. 13c.

In step 9: a fourth metal layer structure 1109 is manufactured on a side of the second interlayer dielectric layer structure 1108 away from the third metal layer structure 1107, and the fourth metal layer structure 1109 fills the third via hole 103, so that the fourth metal layer structure 1109 is electrically coupled to the second metal layer structure 1105. Step 9 is a process of manufacturing the SD2 layer, as shown in FIG. 12g. A film structure after the manufacture in step 9 is shown in FIG. 13d.

Optionally, as shown in FIG. 8 and FIG. 10, after manufacturing a first metal layer 1003 on a side of the first insulating layer 1002 away from the active layer in step S1103, and before manufacturing a light-emitting element 120 on a side of each pixel circuit structure away from the base substrate 1120 in step S1104, the method includes: sequentially manufacturing a third insulating layer 1010, a fifth metal layer 1011, and a third interlayer dielectric layer 1012 on a side of the first metal layer 1003 away from the first insulating layer 1002, where the third insulating layer 1010 includes a third insulating structure 1110, the fifth metal layer 1011 includes a fifth metal layer structure 1111, and the third interlayer dielectric layer 1012 includes a third interlayer dielectric layer structure 1112.

The third interlayer dielectric layer structure 1112 is etched to form a sixth via hole 106 so that the fifth metal layer structure 1111 is partially exposed.

A sixth metal layer 1013 is prepared on a side of the third interlayer dielectric layer 1012 away from the fifth metal layer 1011, so that the sixth metal layer 1013 is electrically coupled to the fifth metal layer structure 1111. The sixth metal layer 1013 includes a sixth metal layer structure 1113, the sixth metal layer structure 1113 fills the sixth via hole 106, and is electrically coupled to the fifth metal layer structure 1111.

A fourth interlayer dielectric layer 1014 is prepared on a side of the sixth metal layer 1013 away from the third interlayer dielectric layer 1012, and the fourth interlayer dielectric layer 1014 includes a fourth interlayer dielectric layer structure 1114.

The third insulating structure 1110, the third interlayer dielectric layer structure 1112, and the fourth interlayer dielectric layer structure 1114 are etched to form the fourth via hole 104, so that the first metal layer structure 1103 of the driving transistor 111 is partially exposed.

A seventh metal layer 1015 is prepared on a side of the fourth interlayer dielectric layer 1014 away from the sixth metal layer 1013, so that the seventh metal layer 1015 is electrically coupled to the first metal layer structure 1103 of the driving transistor 111. The seventh metal layer 1015 includes a seventh metal layer structure 1115. The seventh metal layer structure 1115 fills the fourth via hole 104 and is electrically coupled to the first metal layer structure 1103 of the driving transistor 111.

As an example, referring to FIGS. 16a to 16d, in combination with a film structure shown in FIGS. 15a to 15g, and FIG. 9, a method for manufacturing a pixel circuit structure of an array substrate is provided. An example of a process for manufacturing one sub-pixel unit 100 is given, which includes step 1 to step 9.

In step 1, an active structure 1101 of the second active layer 1001b is manufactured on one side of the base substrate 1120. Step 1 is to prepare a Poly layer, as shown in FIG. 15a, the Poly layer forms a channel of a switching component or serves as a wire or line.

In step 2, a first insulating layer 1002 is manufactured on a side of the active structure 1101 away from the base substrate 1120, and the first insulating layer 1002 includes the first insulating structure 1102. Step 2 is to prepare a GI1 layer, the GI1 layer is a layer with a relatively high transparency, the GI1 layer is a film coated by insulation materials, and no mask is used.

In step 3, a plurality of first metal layer structures 1103 of the first metal layer 1003 are manufactured on a side of the first insulating layer 1002 away from the active structure 1101. Step 3 is to prepare a Gate1 layer, as shown in FIG. 15b. A film structure after step 3 is completed is shown in FIG. 16a.

In step 4, a third insulating layer 1010 is manufactured on a side of the first metal layer structure 1103 away from the first insulating layer 1002, and the third insulating layer 1010 includes a third insulating structure 1110. Step 4 is to prepare a GI3 layer, which is a layer with a relatively high transparency and is a film coated by insulation materials without using a mask.

In step 5, a fifth metal layer structure 1111 of the fifth metal layer 1011 is manufactured on a side of the third insulating layer 1010 away from the first metal layer structure 1103, and the fifth metal layer structure 1111 has a second opening 11111. Step 5 is to prepare a Gate3 layer, as shown in FIG. 15c. A film structure after the manufacture in step 5 is shown in FIG. 16b.

In step 6, a third interlayer dielectric layer structure 1112 of a third interlayer dielectric layer 1012 is manufactured on a side of the fifth metal layer structure 1111 away from the third insulating layer 1010, and the third interlayer dielectric layer structure 1112 is etched to form a sixth via hole 106, so that the fifth metal layer structure 1111 is partially exposed. Step 6 is a process of manufacturing the ILD3 layer and opening the first via hole 101 and the sixth via hole 106. The ILD3 layer is a layer with a relatively high transparency, as shown in FIG. 15d.

In step 7, a sixth metal layer structure 1113 of a sixth metal layer 1013 is manufactured on a side of the third interlayer dielectric layer structure 1112 away from the fifth metal layer structure 1111, and the sixth metal layer structure 1113 fills the sixth via hole 106, so as to cause the sixth metal layer structure 1113 and the fifth metal layer structure 1111 to be electrically coupled or connected. Step 7 is a process of manufacturing the SD3 layer, as shown in FIG. 15e. A film structure after the manufacture in step 7 is shown in FIG. 16c.

In step 8, a fourth interlayer dielectric layer structure 1114 of a fourth interlayer dielectric layer 1014 is manufactured on a side of the sixth metal layer structure 1113 away from the third interlayer dielectric layer structure 1112, and the third insulating structure 1110, the third interlayer dielectric layer structure 1112 and the fourth interlayer dielectric layer structure 1114 are etched to form a fourth via hole 104, so that the first metal layer structure 1103 of the driving transistor 111 is partially exposed. The third insulating structure 1110, the third interlayer dielectric layer structure 1112 and the fourth interlayer dielectric layer structure 1114 are etched to form a fifth via hole 105, so that the active structure 1101 is partially exposed.

Specifically, the fourth via hole 104 is located inside the second opening 11111 of the fifth metal layer structure 1111, so that the conductive metal filling the fourth via hole 104 does not contact the fifth metal layer structure 1111. Step 8 is a process of manufacturing the ILD4 layer and opening the fourth via hole 104 and the fifth via hole 105. The ILD4 layer is a layer with a relatively high transparency, as shown in FIG. 15f.

In step 9, a seventh metal layer structure 1115 of a seventh metal layer 1015 is manufactured on a side of the fourth interlayer dielectric layer structure 1114 away from the sixth metal layer structure 1113, and the seventh metal layer structure 1115 fills the fourth via hole 104 and the fifth via hole 105, so that the seventh metal layer structure 1115 is electrically coupled to the first metal layer structure 1103 of the driving transistor 111 and the active structure 1101 of the second reset transistor 113. Step 9 is a process of manufacturing a SD4 layer, as shown in FIG. 15g. A film structure after the manufacture in step 9 is shown in FIG. 16d.

The beneficial technical effects brought about by the technical solutions provided by the embodiments of the present disclosure are as follows.

In the array substrate of the embodiment of the present disclosure, the active structure of the first reset transistor of the sub-pixel unit in the i-th row is electrically coupled to the anode of the light-emitting element of the sub-pixel unit in the i-th row, and is electrically coupled to the active structure of the second reset transistor of the sub-pixel unit in the (i+1)-th row, and the first metal layer structure of the driving transistor is electrically coupled to the active structure of the second reset transistor. This electrical connection enables a second reset transistor in a current row to be connected to an anode of the light-emitting element in the previous row through a first reset transistor in the previous row, which can simultaneously reset potentials of a gate electrode of a driving transistor in the current row and the anode of the light-emitting element in the previous row, and the reset does not require a TFT and a reset signal line arranged for each pixel unit to realize the reset, which is conducive to saving the layout space and improving the PPI.

Moreover, the active structure of the first reset transistor of the embodiment of the present disclosure is electrically coupled to the anode of the light-emitting element of the i-th row of sub-pixel unit, and is electrically coupled to the active structure of the second reset transistor of the (i+1)-th row of sub-pixel unit, the first metal layer structure of the driving transistor is electrically coupled to the active structure of the second reset transistor, which is equivalent to forming the first reset transistor in a current row correspondingly in the active structure and the first metal layer structure between the anode of the light-emitting element in the previous row and the first metal layer structure of the driving transistor in the current row. Thus, the number of via holes is reduced, the layout space is saved, and the PPI is improved.

Technical or scientific terms used in the embodiments of the present disclosure should be of ordinary meaning as understood by a person of ordinary skill in the art, unless otherwise defined. Such terms as "first", "second" and similar words used in the embodiments of the present disclosure do not represent any order, quantity, or importance, but are merely used to distinguish different components.

Further, in the description of the embodiments of the present disclosure, such terms as "connected" or "coupled" may mean that two components are directly connected or coupled, or that two components are connected or coupled via one or more other components. In addition, the two components can be connected or coupled in a wired or wireless manner.

Further, in the description of the embodiments of the present disclosure, technical terms or scientific terms used in the present disclosure should be in the ordinary meaning as understood by a person of ordinary skill in the art, unless otherwise defined.

Further, in the description of the embodiments of the present disclosure, such terms as "first level" and "second level" are only used to distinguish that magnitudes of the two levels are different. For example, the description may be made hereinafter by taking the "first level" as a relatively high level, and the "second level" as a relatively low level. A person of ordinary skill in the art may appreciate that the present disclosure is not limited thereto.

In the description of this specification, specific features, structures, materials or characteristics can be combined in any one or more embodiments or examples in a suitable manner.

It is appreciated that although various steps in the flowchart of the drawings are displayed in sequence as indicated by arrows, these steps are not necessarily performed in an order indicated by the arrows. Unless explicitly stated in this specification, the execution of these steps is not strictly limited in order, and they can be executed in other orders. Moreover, at least part of the steps in the flowchart of the drawings may include multiple sub-steps or multiple stages. These sub-steps or stages are not necessarily executed at the same time, but can be executed at different times, which are also not necessarily performed sequentially, but may be performed alternately with at least a part of other steps, or with sub-steps or stages of other steps.

The above embodiments are only part of embodiments of the present disclosure. It should be noted that those of ordinary skill in the art can make several improvements and modifications without departing from the principle of the present disclosure, and these improvements and modifications shall also fall within the scope of protection of the present disclosure.

What is claimed is:

1. An array substrate, comprising: a plurality of sub-pixel units arranged in an array on a base substrate, wherein:
   each of the sub-pixel units comprises a pixel circuit structure and a light-emitting element;
   the pixel circuit structure comprises a driving transistor, a first reset transistor and a second reset transistor;
   each of the driving transistor, the first reset transistor and the second reset transistor comprises an active structure, a first insulating structure on the active structure, and a first metal layer structure on the first insulating structure;
   the active structure of the first reset transistor of an i-th row of sub-pixel unit is electrically coupled to an anode of the light-emitting element of the i-th row of sub-pixel unit, and is electrically coupled to the active structure of the second reset transistor of an (i+1)-th row of sub-pixel unit, i being an integer greater than 0; and
   in each of the sub-pixel units, the first metal layer structure of the driving transistor is electrically coupled to the active structure of the second reset transistor.

2. The array substrate according to claim 1, wherein each of the sub-pixel units further comprises a second insulating structure, a second metal layer structure, a first interlayer dielectric layer, and a third metal layer structure that are stacked on the first metal layer structure, and
   in the sub-pixel unit, the first metal layer structure of the driving transistor is electrically coupled to a first end of the third metal layer structure of the sub-pixel unit, and a second end of the third metal layer structure is electrically coupled to the active structure of the second reset transistor.

3. The array substrate according to claim 2, wherein an orthographic projection of the first end of the third metal layer structure onto the base substrate of the sub-pixel unit is at least partially overlapped with an orthographic projection of the first metal layer structure of the driving transistor onto the base substrate, and at an area where the orthographic projections are overlapped, a first via hole is arranged in the second insulating structure and the first interlayer dielectric layer structure; and the first end of the third metal layer structure is electrically coupled to the first metal layer structure of the driving transistor through the first via hole.

4. The array substrate according to claim 3, wherein an orthographic projection of the second end of the third metal layer structure onto the base substrate is at least partially overlapped with an orthographic projection of the active structure of the second reset transistor onto the base substrate, and at an area where the orthographic projections are overlapped, a second via hole is arranged in the first insulating structure, the second insulating structure, and the first interlayer dielectric layer structure; and the second end of the third metal layer structure is electrically coupled to the active structure of the second reset transistor through the second via hole.

5. The array substrate according to claim 2, wherein each of the sub-pixel units further comprises a second interlayer dielectric layer structure on the third metal layer structure and a fourth metal layer structure on the second interlayer dielectric layer structure;

a third via hole is arranged in the first interlayer dielectric layer structure and the second interlayer dielectric layer structure; and the fourth metal layer structure is electrically coupled to the second metal layer structure through the third via hole.

6. The array substrate according to claim 1, wherein in each of the sub-pixel units, one of the first metal layer structure of the sub-pixel unit comprises the first metal layer structure of the driving transistor;

each of the sub-pixel units further comprises a second insulating structure, a second metal layer structure, a first interlayer dielectric layer structure, a third metal layer structure, a second interlayer dielectric layer and a fourth metal layer structure that are stacked on the first metal layer structure;

an orthographic projection of the second metal layer structure onto the base substrate partially overlaps with an orthographic projection of the first metal layer structure onto the base substrate, and a first capacitor is formed between the second metal layer structure and the first metal layer structure at an area where the orthographic projections are overlapped;

an orthographic projection of the third metal layer structure onto the base substrate partially overlaps with the orthographic projection of the second metal layer structure onto the base substrate, and a second capacitor is formed between the third metal layer structure and the second metal layer structure at an area where the orthographic projections are overlapped; and an orthographic projection of the fourth metal layer structure onto the base substrate partially overlaps with the orthographic projection of the third metal layer structure onto the base substrate, and a third capacitor is formed the fourth metal layer structure and the third metal layer structure at an area where the orthographic projections are overlapped.

7. The array substrate according to claim 6, wherein the third metal layer structure serves as a reset signal line, and is configured to receive a reset signal; and the fourth metal layer structure serves as a power supply line, and is configured to receive a power supply voltage.

8. The array substrate according to claim 1, wherein each of the sub-pixel units further comprises a third insulating structure, a fifth metal layer structure, a third interlayer dielectric layer structure, a sixth metal layer structure, a fourth interlayer dielectric layer structure and a seventh metal layer structure that are stacked; and in the sub-pixel unit, the first metal layer structure of the driving transistor is electrically coupled to a first end of the seventh metal layer structure of the sub-pixel unit, and a second end of the seventh metal layer structure is electrically coupled to an active structure of the reset transistor.

9. The array substrate according to claim 8, wherein an orthographic projection of the first end of the seventh metal layer structure onto the base substrate of the sub-pixel unit at least partially overlaps with an orthographic projection of the first metal layer structure of the driving transistor onto the base substrate, and at an area where the orthographic projections are overlapped, a fourth via hole is arranged in the third insulating structure, the third interlayer dielectric layer structure and the fourth interlayer dielectric layer structure; and the first end of the seventh metal layer structure is electrically coupled to the first metal layer structure of the driving transistor through the fourth via hole.

10. The array substrate according to claim 9, wherein an orthographic projection of the second end of the seventh metal layer structure onto the base substrate at least partially overlaps with an orthographic projection of the active structure of the second reset transistor onto the base substrate, and at an area where the orthographic projections are overlapped, a fifth via hole is arranged in the third insulating structure, the third interlayer dielectric layer structure and the fourth interlayer dielectric layer structure; and the second end of the seventh metal layer structure is electrically coupled to the active structure of the second reset transistor through the fifth via hole.

11. The array substrate according to claim 8, wherein the third interlayer dielectric layer structure is provided with a sixth via hole; and the sixth metal layer structure is electrically coupled to the fifth metal layer structure through the sixth via hole.

12. The array substrate according to claim 8, wherein an orthographic projection of the fifth metal layer structure onto the base substrate partially overlaps with an orthographic projection of the first metal layer structure onto the base substrate, and at an area where the orthographic projections are overlapped, a fourth capacitor is formed between the fifth metal layer structure and the first metal layer structure; and an orthographic projection of the seventh metal layer structure onto the base substrate partially overlaps with an orthographic projection of the sixth metal layer structure onto the base substrate, and at an area where the orthographic projections are overlapped, a fifth capacitor is formed between the seventh metal layer structure and the sixth metal layer structure.

13. The array substrate according to claim 8, wherein the seventh metal layer structure serves as a reset signal line, and is configured to receive a reset signal; and the sixth metal layer structure serves as a power supply line, and is configured to receive a power supply voltage.

14. The array substrate according to claim 1, wherein both the first metal layer structure of the first reset transistor of the i-th row of sub-pixel unit, and the first metal layer structure of the second reset transistor of the (i+1)-th row of sub-pixel unit belong to the same first metal layer structure of the (i+1)-th row of sub-pixel unit.

15. A display panel, comprising: the array substrate according to claim 1.

16. A display device, comprising: the array substrate according to claim 1.

17. A display device, comprising: the display panel according to claim 15.

\* \* \* \* \*